US012696655B2

(12) United States Patent
Hong

(10) Patent No.: US 12,696,655 B2
(45) Date of Patent: Jul. 28, 2026

(54) DISPLAY DEVICE AND DISPLAY PANEL

(71) Applicant: LG Display Co., Ltd., Seoul (KR)

(72) Inventor: Sungki Hong, Incheon (KR)

(73) Assignee: LG Display Co., Ltd., Seoul (KR)

( * ) Notice: Subject to any disclaimer, the term of this patent is extended or adjusted under 35 U.S.C. 154(b) by 369 days.

(21) Appl. No.: 18/471,867

(22) Filed: Sep. 21, 2023

(65) Prior Publication Data

US 2024/0130197 A1 Apr. 18, 2024

(30) Foreign Application Priority Data

Oct. 18, 2022 (KR) ........................ 10-2022-0134032

(51) Int. Cl.
*H10K 59/80* (2023.01)
*H10K 59/122* (2023.01)
*H10K 59/40* (2023.01)

(52) U.S. Cl.
CPC ..... *H10K 59/80521* (2023.02); *H10K 59/122* (2023.02); *H10K 59/40* (2023.02); *H10K 59/80523* (2023.02)

(58) Field of Classification Search
CPC ........... H10K 59/80521; H10K 59/122; H10K 59/40; H10K 59/80523; H10K 59/8791;

H10K 59/65; H10K 59/879; H10K 59/121; H10K 59/1213; H10K 59/1216; H10K 59/8051; H10K 59/873
See application file for complete search history.

(56) References Cited

U.S. PATENT DOCUMENTS

| | | | |
|---|---|---|---|
| 2020/0135837 A1 | 4/2020 | Cui et al. | |
| 2021/0193765 A1* | 6/2021 | Kim ................... | H10K 59/8792 |
| 2021/0202621 A1* | 7/2021 | Liang ................... | H10K 59/124 |
| 2021/0328199 A1* | 10/2021 | Yao ........................ | H10K 59/122 |
| 2021/0408151 A1 | 12/2021 | Choi et al. | |
| 2022/0165984 A1* | 5/2022 | Choi ................... | H10K 59/121 |
| 2022/0376213 A1* | 11/2022 | Ma ......................... | H10K 59/38 |

* cited by examiner

*Primary Examiner* — Yasser A Abdelaziez
(74) *Attorney, Agent, or Firm* — Seed Intellectual Property Law Group LLP

(57) ABSTRACT

The present disclosure provides a display device and a display panel. The display device includes an optical area included in a display area in which images can be displayed and allowing light to be transmitted, a normal area included in the display area and located outside of the optical area, a cathode electrode commonly disposed in the optical area and the normal area and including a plurality of cathode holes in the optical area, and a plurality of ring patterns respectively corresponding to the plurality of cathode holes. As each ring pattern is disposed to overlap an edge of each cathode hole, an optical electronic device located under the optical area is able to perform a high-performance operation. For example, when the optical electronic device is a camera, the display device enables the camera to acquire a high-quality image.

21 Claims, 22 Drawing Sheets

*Front View*          *Side View*

Left Side View        Front View        Right Side View

Left Side View       Front View       Right Side View

DISPLAY DEVICE AND DISPLAY PANEL

CROSS-REFERENCE TO RELATED APPLICATION

This application claims the priority benefit of Republic of Korea Patent Application No. 10-2022-0134032, filed on Oct. 18, 2022, in the Korean Intellectual Property Office, which is incorporated herein by reference in its entirety.

BACKGROUND

Technical Field

The present disclosure relates to electronic devices, and more particularly, to a display device and a display panel, which may include one or more optical electronic devices not exposed on front surfaces thereof, for example.

Description of the Related Art

As display technology advances, display devices can provide increased functions, such as an image capture function, a sensing function, and the like, as well as an image display function. To provide these functions, a display device may need to include one or more optical electronic devices, such as a camera, a sensor for detecting an image, and the like.

In order to receive light passing through a front surface of a display device, it may be beneficial for such an optical electronic device to be located in an area of the display device where incident light coming from the front surface can be increasingly received and detected. To achieve the foregoing, in a typical display device, an optical electronic device has been designed to be located in a front portion of the display device to allow a camera, a sensor, and/or the like as the optical electronic device to be increasingly exposed to incident light. In order to install an optical electronic device in a display device in this manner, a bezel area of the display device may be increased, or a notch or a hole may be needed to be formed in a display area of an associated display panel.

BRIEF SUMMARY

An optical electronic device incorporated within a display device receives or detects incident light, and performs an intended function. Accordingly, a size of the bezel in the front portion of the display device may be increased, or a substantial disadvantage may be encountered in designing the front portion of the display device. In addition, in instances where an optical electronic device is configured in a display device, the quality of images may be unexpectedly decreased and the performance of the optical electronic device may be impaired according to structures in which the optical electronic device is configured in the display device. For example, in an instance where the optical electronic device is a camera, image quality acquired by the camera may be decreased.

To address these issues, one or more embodiments of the present disclosure provide a display panel and a display device that include a light transmission structure for enabling at least one optical electronic device to normally receive light (e.g., visible light, infrared light, ultraviolet light, or the like) while not being exposed in a front surface of the display device.

One or more embodiments of the present disclosure provide a display panel and a display device that are capable of improving the performance of an optical electronic device by reducing the amount of diffraction of light that may occur while light is transmitted through the display panel due to a structure in which the optical electronic device is disposed under, or in a lower location of, a display area of the display panel.

One or more embodiments of the present disclosure provide a display panel and a display device that are capable of enabling a camera, which is an optical electronic device under, or in a lower location of, a display area of the display panel, to acquire high quality images.

According to aspects of the present disclosure, a display device can be provided that includes an optical area included in a display area in which images can be displayed and allowing light to be transmitted, a normal area included in the display area and located outside of the optical area, a cathode electrode commonly disposed in the optical area and the normal area and including a plurality of cathode holes in the optical area, and a ring pattern corresponding to any one of the plurality of cathode holes and disposed to overlap an edge of any one of the plurality of cathode holes.

The ring pattern may include a plurality of protrusions protruding toward the inside of any one of the plurality of cathode holes. All or a portion of each of the plurality of protrusions of the ring pattern may not overlap the cathode electrode.

The ring pattern may include a plurality of metal rings located in a plurality of different metal layers.

Each of the plurality of metal rings may include a plurality of protrusions protruding toward the inside of any one of the plurality of cathode holes.

According to aspects of the present disclosure, a display panel can be provided that includes a plurality of transmission areas included in a display area in which images can be displayed and allowing light to be transmitted, a cathode electrode including a plurality of cathode holes respectively corresponding to the plurality of transmission areas, and a ring pattern corresponding to any one of the plurality of cathode holes and including a plurality of protrusions protruding toward the inside of any one of the plurality of cathode holes.

The ring pattern may be disposed along an edge of any one of the plurality of cathode holes.

The ring pattern may be disposed to overlap the edge of any one of the plurality of cathode holes.

The ring pattern may include a plurality of protrusions protruding toward the inside of any one of the plurality of cathode holes. All or a portion of each of the plurality of protrusions of the ring pattern may not overlap the cathode electrode.

The ring pattern may include a plurality of metal rings located in a plurality of different metal layers. The plurality of metal layers may be included in metal layers included in a pixel circuit for image display.

According to one or more embodiments of the present disclosure, a display panel and a display device can be provided that include a light transmission structure for enabling at least one optical electronic device to normally receive light (e.g., visible light, infrared light, ultraviolet light, or the like) while not being exposed in a front surface of the display device.

According to one or more embodiments of the present disclosure, a display panel and a display device can be provided that are capable of improving the performance of an optical electronic device by reducing the amount of diffraction of light that may occur while light is transmitted through the display panel due to a structure in which the optical electronic device is disposed under, or in a lower location of, a display area of the display panel.

According to one or more embodiments of the present disclosure, a display panel and a display device can be provided that are capable of enabling a camera, which is an optical electronic device under, or in a lower location of, a display area of the display panel, to acquire high quality images.

Additional features and aspects will be set forth in part in the description which follows and in part will become apparent from the description or may be learned by practice of the inventive concepts provided herein. Other features and aspects of the inventive concepts may be realized and attained by the structure particularly pointed out in, or derivable from, the written description, the claims hereof, and the appended drawings. Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. It is to be understood that both the foregoing general description and the following detailed description of the present disclosure are exemplary and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1A:
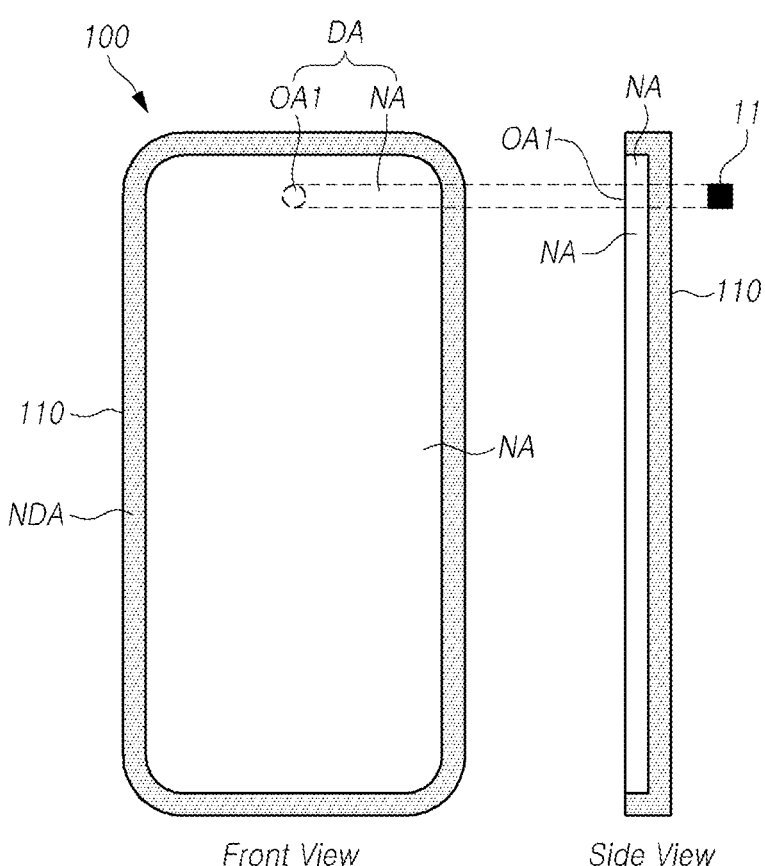
FIGS. 1A, 1B, and 1C illustrate an example display device according to aspects of the present disclosure.

The advantages and features of the present disclosure and methods of achieving the same will be apparent by referring to embodiments of the present disclosure as described below in detail with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure.

Shapes, sizes, dimensions (e.g., length, width, height, thickness, radius, diameter, area, etc.), ratios, angles, number of elements, and the like, which are illustrated in the drawings to describe various example embodiments of the present disclosure are merely given by way of example. Therefore, the present disclosure is not limited to the illustrations in the drawings.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals designate like elements throughout, unless otherwise specified. Names of the respective elements used in the following explanations are selected only for convenience of writing the specification and may thus be different from those used in actual products. In the following description, where the detailed description of the relevant known function or configuration may unnecessarily obscure aspects of the present disclosure, a detailed description of such known function or configuration may be omitted. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided. Further, the term "may" fully encompass all the meanings of the term "can."

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference. For the expression that an element or layer "contacts," "overlaps," or the like with another element or layer, the element or layer can not only directly contact, overlap, or the like with another element or layer, but indirectly contact, overlap, or the like with another element or layer with one or more intervening elements or layers "disposed" or "interposed" between the elements or layers, unless otherwise specified.

Time relative terms, such as "after," "subsequent to," "next to," "before," or the like, used to describe a temporal relationship between events, operations, or the like are generally intended to include events, situations, cases, operations, or the like that do not occur consecutively unless the terms, such as "directly," "immediately," or the like, are used. In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," and the like may be used herein to describe various elements, these elements should not be interpreted to be limited by these terms. These terms are used only to distinguish one element from another. For example, a first element could be termed a second element, and, similarly, a second element could be termed a first element, without departing from the scope.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified.

Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings. In describing example embodiments of the present disclosure, equated or corresponding elements or configurations as embodiment previously described will not be repeatedly discussed. Discussions on example embodiments of the present disclosure are provided below.

Figure 1B:
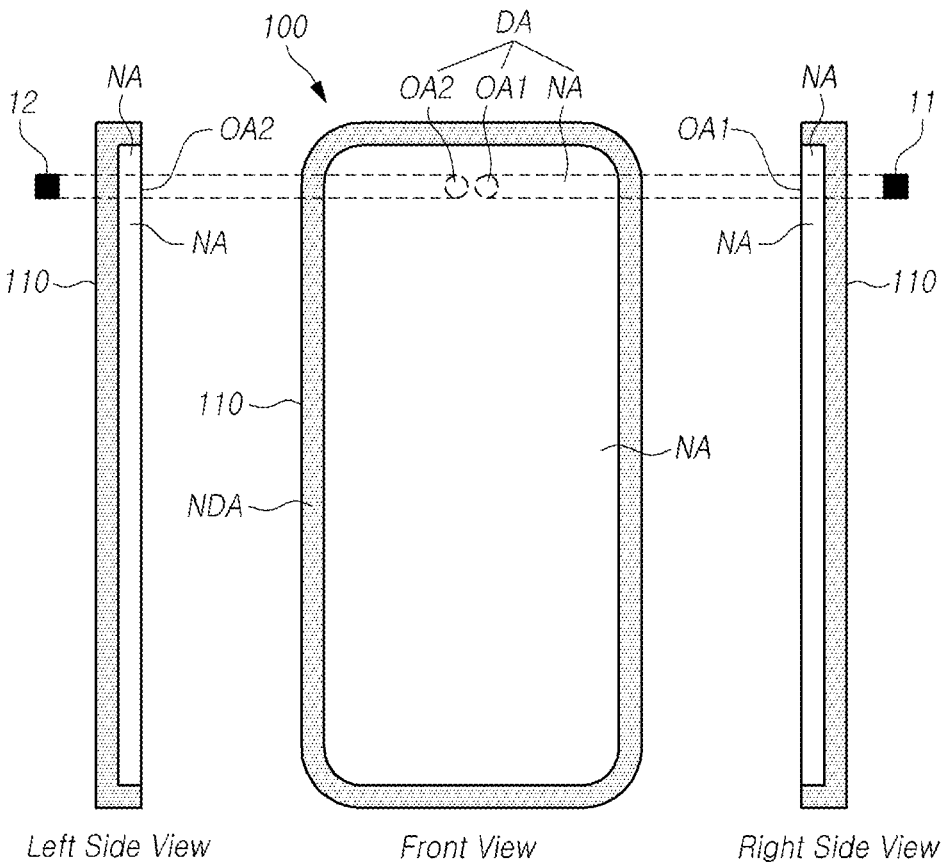
Figure 1C:
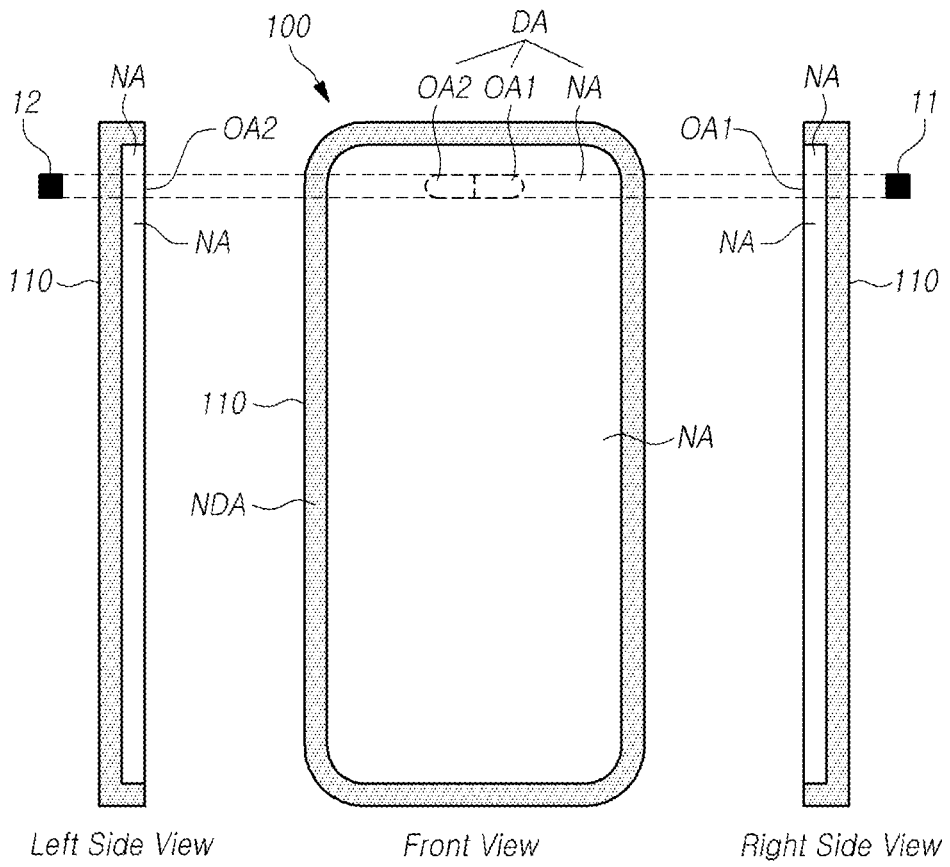

FIGS. 1A, 1B, and 1C illustrate an example display device 100 according to aspects of the present disclosure.

Referring to FIGS. 1A, 1B, and 1C, the display device 100 according to aspects of the present disclosure may include a display panel 110 for displaying one or more images, and one or more optical electronic devices (11 and/or 12). Herein, an optical electronic device may be referred to as a light detector, a light receiver, or a light sensing device. An optical electronic device may include one or more of a camera, a camera lens, a sensor, a sensor for detecting images, or the like.

The display panel 110 may include a display area DA in which one or more images can be displayed and a non-display area NDA in which an image is not displayed.

A plurality of subpixels may be arranged in the display area DA, and several types of signal lines for driving the plurality of subpixels may be arranged in the display area DA.

The non-display area NDA may refer to an area outside of the display area DA. Several types of signal lines may be arranged in the non-display area NDA, and several types of driving circuits may be connected thereto. At least a portion of the non-display area NDA may be bent to be invisible from the front surface of the display device 100 or may be covered by a case or housing (not shown) of the display device 100. The non-display area NDA may be also referred to as a bezel or a bezel area.

Referring to FIGS. 1A, 1B, and 1C, in the display device 100 according to aspects of the present disclosure, one or more optical electronic devices (11 and/or 12) may be prepared independently of, and installed in, the display panel 110, and be located under, or in a lower portion of, the display panel 110 (an opposite side of a viewing surface thereof).

Light can enter the front surface (the viewing surface) of the display panel 110, pass through the display panel 110, reach one or more optical electronic devices (11 and/or 12) located under, or in the lower portion of, the display panel 110 (the opposite side of the viewing surface). Light passing through the display panel 110 may include, for example, visible light, infrared light, or ultraviolet light.

The one or more optical electronic devices (11 and/or 12) may be devices capable of receiving or detecting light passing through the display panel 110 and performing a predefined function based on the received light. For example, the one or more optical electronic devices (11 and/or 12) may include one or more of the following: an image capture device such as a camera (an image sensor), and/or the like; or a sensor such as a proximity sensor, an illuminance sensor, and/or the like. Such a sensor may be, for example, an infrared sensor capable of detecting infrared light.

Referring to FIGS. 1A, 1B, and 1C, in one or more aspects, the display area DA of the display panel 110 according to aspects of the present disclosure may include one or more optical areas (OA1 and/or OA2) and a normal area NA. Herein, the term "normal area" NA is an area that while being present in the display area DA, does not overlap with one or more optical electronic devices (11 and/or 12) and may also be referred to as a non-optical area. The one or more optical areas (OA1 and/or OA2) may be one or more areas respectively overlapping the one or more optical electronic devices (11 and/or 12) in a cross-sectional view of the display panel 110.

According to an example of FIG. 1A, the display area DA may include a first optical area OA1 and a normal area NA. In this example, at least a portion of the first optical area OA1 may overlap a first optical electronic device 11.

According to an example of FIG. 1B, the display area DA may include a first optical area OA1, a second optical area OA2, and a normal area NA. In this example, a portion of the normal area NA may be present between the first optical area OA1 and the second optical area OA2. At least a portion of the first optical area OA1 may overlap the first optical electronic device 11, and at least a portion of the second optical area OA2 may overlap a second optical electronic device 12.

According to an example of FIG. 1C, the display area DA may include a first optical area OA1, a second optical area OA2, and a normal area NA. In this example, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In the display panel 110 or the display device 100 according to aspects of the present disclosure, it may be beneficial that both an image display structure and a light transmission structure are implemented in the one or more optical areas (OA1 and/or OA2). For example, since the one or more optical areas (OA1 and/or OA2) are portions of the display area DA, it is therefore beneficial that light emitting areas of subpixels for displaying one or more images are disposed in the one or more optical areas (OA1 and/or OA2). Further, to enable light to be transmitted through the one or more optical electronic devices (11 and/or 12), it may be beneficial that a light transmission structure is implemented in the one or more optical areas (OA1 and/or OA2).

It should be noted that even though the one or more optical electronic devices (11 and/or 12) are devices that is configured to receive light, the one or more optical electronic devices (11 and/or 12) may be located on the back of the display panel 110 (e.g., on an opposite side of the viewing surface thereof), and thereby, can receive light that has passed through the display panel 110. For example, the one or more optical electronic devices (11 and/or 12) may not be exposed in the front surface (viewing surface) of the display panel 110 or the display device 100. Accordingly, when a user faces the front surface of the display device 100, the one or more optical electronic devices (11 and/or 12) are located so that they are not visible to the user.

The first optical electronic device 11 may be, for example, a camera, and the second optical electronic device 12 may be, for example, a sensor. The sensor may be a proximity sensor, an illuminance sensor, an infrared sensor, and/or the like. In one or more embodiments, the camera may be a camera lens, an image sensor, or a unit including at least one of the camera lens and the image sensor, and the sensor may be an infrared sensor capable of detecting infrared light. In another embodiment, the first optical electronic device 11 may be a sensor, and the second optical electronic device 12 may be a camera.

Hereinafter, for convenience of descriptions related to the optical electronic devices (11 and 12), the first optical electronic device 11 is considered to be a camera, and the second optical electronic device 12 is considered to be an infrared sensor. It should be, however, understood that the scope of the present disclosure includes examples where the first optical electronic device 11 is an infrared sensor, and the second optical electronic device 12 is a camera. The camera may be, for example, a camera lens, an image sensor, or a unit including at least one of the camera lens and the image sensor.

In an example where the first optical electronic device 11 is a camera, this camera may be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

Although the normal area NA and the one or more optical areas (OA1 and/or OA2) included in the display area DA in each of FIGS. 1A, 1B, and 1C are areas where images are allowed to be displayed, the normal area NA is an area where a light transmission structure need not be implemented, but the one or more optical areas (OA1 and/or OA2) are areas where it is beneficial to have a light transmission structure implemented. Thus, in one or more embodiments, the normal area NA is an area where a light transmission structure is not implemented or included, and the one or more optical areas (OA1 and/or OA2) are areas in which a light transmission structure is implemented or included.

Accordingly, the one or more optical areas (OA1 and/or OA2) can have a transmittance greater than or equal to a predetermined level, e.g., a relatively high transmittance, and the normal area NA can have a transmittance less than the predetermined level or not have light transmittance.

For example, the one or more optical areas (OA1 and/or OA2) may have a resolution, a subpixel arrangement structure, the number of subpixels per unit area, an electrode structure, a line structure, an electrode arrangement structure, a line arrangement structure, and/or the like different from that/those of the normal area NA.

In one embodiment, the number of subpixels per unit area in the one or more optical areas (OA1 and/or OA2) may be less than the number of subpixels per unit area in the normal area NA. For example, the resolution of the one or more optical areas (OA1 and/or OA2) may be lower than that of the normal area NA. In this example, the number of subpixels per unit area may have the same meaning as a resolution, a pixel density, or a degree of integration of pixels. For example, the unit of the number of subpixels per unit area may be pixels per inch (PPI), which represents the number of pixels within 1 inch.

In the examples of FIGS. 1A, 1B, and 1C, the number of subpixels per unit area in the first optical areas OA1 may be less than the number of subpixels per unit area in the normal area NA. In the examples of FIGS. 1B and 1C, the number of subpixels per unit area in the second optical areas OA2 may be greater than or equal to the number of subpixels per unit area in the first optical areas OA1, and be less than the number of subpixels per unit area in the normal area NA.

In one or more embodiments, as a method for increasing respective transmittance of at least one of the first optical area OA1 and the second optical area OA2, a technique (which may be referred to as a "pixel density differentiation design scheme") may be applied so that a density of pixels (or subpixels) or a degree of integration of pixels (or subpixels) can be differentiated as described above. According to the pixel density differentiation design scheme, in an embodiment, the display panel 110 may be configured or designed such that the number of subpixels per unit area of at least one of the first optical area OA1 and the second optical area OA2 is smaller than the number of subpixels per unit area of the normal area NA.

In one or more embodiments, as another method for increasing respective transmittance of at least one of the first optical area OA1 and the second optical area OA2, a technique (which may be referred to as a "pixel size differentiation design scheme") may be applied so that a size of a pixel (or a subpixel) can be differentiated. According to the pixel size differentiation design scheme, the display panel 110 may be configured or designed such that the number of subpixels per unit area of at least one of the first optical area OA1 and the second optical area OA2 is equal to or similar to the number of subpixels per unit area of the normal area NA; however, a size of each subpixel (e.g., a size of a corresponding light emitting area) disposed in at least one of the first optical area OA1 and the second optical area OA2 is smaller than a size of each subpixel (e.g., a size of a corresponding light emitting area) disposed in the normal area NA.

In one or more aspects, for convenience of description, discussions that follow are provided based on the pixel density differentiation design scheme of the two schemes (e.g., the pixel density differentiation design scheme and the pixel size differentiation design scheme) for increasing respective transmittance of at least one of the first optical area OA1 and the second optical area OA2, unless explicitly stated otherwise. It should be therefore understood that in descriptions that follow, a small number of subpixels per unit area may be considered as corresponding to a small size of subpixel, and a large number of subpixels per unit area may be considered as corresponding to a large size of subpixel.

In the examples of FIGS. 1A, 1B, and 1C, the first optical area OA1 may have various shapes, such as a circle, an ellipse, a quadrangle, a hexagon, an octagon or the like. In the examples of FIGS. 1B and 1C, the second optical area OA2 may have various shapes, such as a circle, an ellipse, a quadrangle, a hexagon, an octagon or the like. The first optical area OA1 and the second optical area OA2 may have the same or substantially or nearly the same shape, or different shapes.

Referring to FIG. 1C, in the example where the first optical area OA1 and the second optical area OA2 contact each other (e.g., directly contact each other), the entire optical area including the first optical area OA1 and the second optical area OA2 may also have various shapes, such as a circle, an ellipse, a quadrangle, a hexagon, an octagon or the like. Hereinafter, for convenience of descriptions related to shapes of the optical areas (OA1 and OA2), each of the first optical area OA1 and the second optical area OA2 is considered to have a circular shape. It should be, however, understood that the scope of the present disclosure includes examples where at least one of the first optical area OA1 and the second optical area OA2 have a shape other than a circular shape.

According to one or more aspects of the present disclosure, when the display device 100 has a structure in which the first optical electronic device 11 such as a camera, and the like is located under, or in a lower portion of, the display panel 100 without being exposed to the outside, such a display device may be referred to as a display in which a under-display camera (UDC) technology is implemented.

The display device 100 in which such an under-display camera (UDC) technology is implemented can provide an advantage of preventing a reduction of an area or size of the display area DA because a notch or a camera hole for exposing a camera need not be formed in the display panel 110. Indeed, since the notch or the camera hole for camera exposure need not be formed in the display panel 110, the display device 100 can provide further advantages of reducing the size of the bezel area, and improving the degree of freedom in design because such limitations to the design are removed.

Although the one or more optical electronic devices (11 and/or 12) are located on the back of (e.g., under, or in a lower portion of) the display panel 110 of the display device 100 (e.g., hidden or not exposed to the outside), it is beneficial that the one or more optical electronic devices (11 and/or 12) are able to perform their normal predefined functionalities by receiving or detecting light.

Further, although one or more optical electronic devices (11 and/or 12) are located on the back of (e.g., under, or in a lower portion of) the display panel 110 to be hidden and thus located to overlap the display area DA, it is beneficial that the display device 100 is able to normally display one or more images in the one or more optical areas (OA1 and/or OA2) overlapping the one or more optical electronic devices (11 and/or 12) in the display area DA. Thus, even though one or more optical electronic devices (11 and/or 12) are located on the back of the display panel, the display device 100 according to aspects of the present disclosure can be configured to display images in a normal manner (e.g., without reduction in image quality) in the one or more optical areas (OA1 and/or OA2) overlapping the one or more optical electronic devices (11 and/or 12) in the display area DA.

Since the foregoing first optical area OA1 is configured or designed as a transmittable area, the quality of image display in the first optical area OA1 may be different from the quality of image display in the normal area NA.

Further, when designing the first optical area OA1 for the purpose of improving the quality of image display, there may be caused a situation that the transmittance of the first optical area OA1 is reduced.

To address these issues, in one or more aspects, the first optical area OA1 included in the display device 100 or the display panel may be configured with, or include, a structure capable of preventing a difference (e.g., non-uniformity) in image quality between the first optical area OA1 and the normal area NA from being caused, and improving the transmittance of the first optical area OA1.

Further, not only the first optical area OA1, but the second optical area OA2 included in the display device 100 or the display panel 110 according to aspects of the present disclosure may be configured with, or include, a structure capable of improving the image quality of the second optical area OA2, and improving the transmittance of the second optical area OA2.

It should be also noted that the first optical area OA1 and the second optical area OA2 included in the display device 100 or the display panel 110 according to aspects of the present disclosure may be differently implemented or have different utilization examples while having a similarity in terms of light transmittable areas. Taking account of such a distinction, the structure of the first optical area OA1 and the structure of the second optical area OA2 in the display device 100 according to aspects of the present disclosure may be configured or designed differently from each other.

Figure 2:
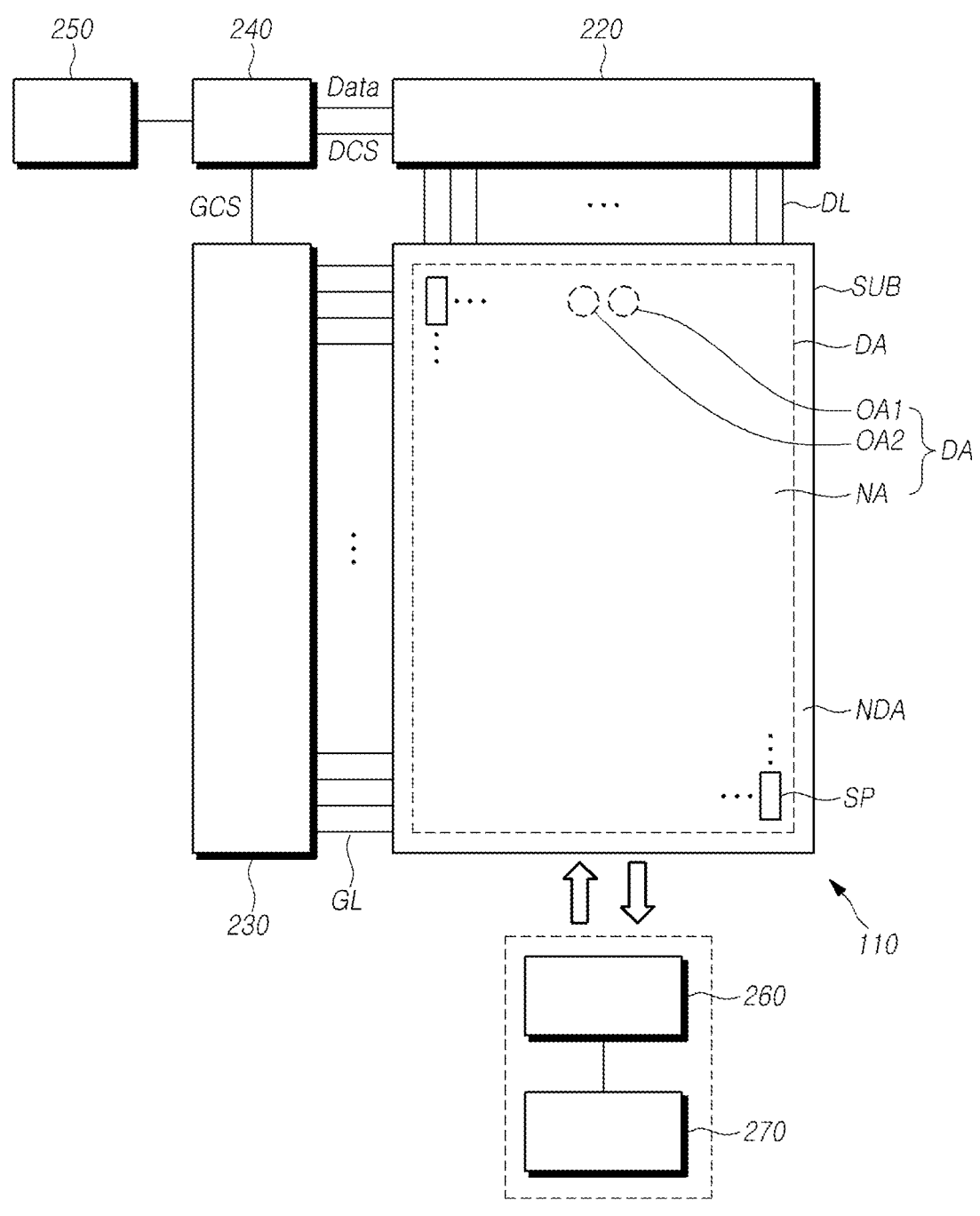
FIG. 2 illustrates an example system configuration of the display device according to aspects of the present disclosure.

FIG. 2 illustrates an example system configuration of the display device 100 according to one or more embodiments of the present disclosure. Referring to FIG. 2, the display device 100 may include the display panel 110 and a display driving circuit as components for displaying one or more images.

The display driving circuit is a circuit for driving the display panel 110, and may include a data driving circuit 220, a gate driving circuit 230, a display controller 240, and other circuit components.

The display panel 110 may include a display area DA in which one or more images can be displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel 110 may include a substrate SUB and a plurality of subpixels SP disposed on the substrate SUB. The display panel 110 may further include various types of signal lines to drive the plurality of subpixels SP.

The display device 100 according to aspects of the present disclosure may be a liquid crystal display device, or the like, or a self-emission display device in which light is emitted from the display panel 110 itself. In examples where the display device 100 according to aspects of the present disclosure is implemented as a self-emission display device, each of the plurality of subpixels SP may include a light emitting element. For example, the display device 100 according to aspects of the present disclosure may be an organic light emitting display device implemented with one or more organic light emitting diodes (OLED). In another example, the display device 100 according to aspects of the present disclosure may be an inorganic light emitting display device implemented with one or more inorganic material-based light emitting diodes. In further another example, the display device 100 according to aspects of the present disclosure may be a quantum dot display device implemented with quantum dots, which are self-emission semiconductor crystals.

The structure of each of the plurality of subpixels SP may be differently configured or designed according to types of the display devices 100. For example, in an example where the display device 100 is a self-emission display device including self-emission subpixels SP, each subpixel SP may include a self-emission light emitting element, one or more transistors, and one or more capacitors.

In one or more embodiments, various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like.

The plurality of data lines DL and the plurality of gate lines GL may intersect each other. Each of the plurality of data lines DL may extend in a first direction. Each of the plurality of gate lines GL may extend in a second direction different from the first direction. For example, the first direction may be a column or vertical direction, and the second direction may be a row or horizontal direction. In another example, the first direction may be the row or horizontal direction, and the second direction may be the column or vertical direction.

The data driving circuit 220 may be a circuit for driving the plurality of data lines DL, and can supply data signals to the plurality of data lines DL. The gate driving circuit 230 may be a circuit for driving the plurality of gate lines GL, and can supply gate signals to the plurality of gate lines GL.

The display controller 240 may be a device for controlling the data driving circuit 220 and the gate driving circuit 230, and can control driving times for the plurality of data lines DL and driving times for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can receive digital image data Data from the display controller 240, convert the received image data Data into analog data signals, and supply the resulting analog data signals to the plurality of data lines DL.

The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In one or more embodiments, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In one or more embodiments, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 may be disposed in the non-display area NDA of the display panel 110 in a gate in panel (GIP) type. The gate driving circuit 230 may be disposed on or over the substrate, or connected to the substrate. That is, in the case of the GIP type, the gate driving circuit 230 may be disposed in the non-display area NDA of the substrate. In the case of the chip on glass (COG) type, the chip on film (COF) type, or the like, the gate driving circuit 230 may be connected to the substrate.

In one or more embodiments, at least one of the data driving circuit 220 and the gate driving circuit 230 may be disposed in the display area DA of the display panel 110. For example, at least one of the data driving circuit 220 and the gate driving circuit 230 may be disposed such that it does not overlap subpixels SP, or disposed such that it overlaps one or more, or all, of the subpixels SP, or at least respective one or more portions of one or more subpixels.

The data driving circuit 220 may be located on, but not limited to, only one side or portion (e.g., an upper edge or a lower edge) of the display panel 110. In one or more embodiments, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in only one side or portion (e.g., a left edge or a right edge) of the display panel 110. In one or more embodiments, the gate driving circuit 230 may be connected to two sides or portions (e.g., a left edge and a right edge) of the display panel 110, or be connected to at least two of four sides or portions (e.g., an upper edge, a lower edge, the left edge, and the right edge) of the display panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of performing other control functions in addition to the function of the typical timing controller. In one or more embodiments, the display controller 240 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like.

The display controller 240 may be mounted on a printed circuit board, a flexible printed circuit, and/or the like and be electrically connected to the gate driving circuit 230 and the data driving circuit 220 through the printed circuit board, flexible printed circuit, and/or the like.

The display controller 240 may transmit signals to, and receive signals from, the data driving circuit 220 via one or more predefined interfaces. For example, such interfaces may include a low voltage differential signaling (LVDS) interface, an embedded clock point-point (EPI) interface, a serial peripheral interface (SPI), and the like.

In order to further provide a touch sensing function, as well as an image display function, the display device 100 according to aspects of the present disclosure may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit may include: a touch driving circuit 260 capable of generating and providing touch sensing data by driving and sensing the touch sensor; a touch controller 270 capable of detecting the occurrence of a touch event or detecting a touch position using the touch sensing data; and one or more other components.

The touch sensor may include a plurality of touch electrodes. The touch sensor may further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. In the example where the touch sensor is implemented in the touch panel, or in the form of the touch panel, outside of the display panel 110, such a touch sensor is referred to as an add-on type. In the example where such an add-on type of touch sensor is disposed, the touch panel and the display panel 110 may be separately manufactured and coupled during an assembly process. The add-on type of touch panel may include a touch panel substrate and a plurality of touch electrodes on the touch panel substrate.

In order to have the touch sensor implemented inside of the display panel 110, a process of manufacturing the display panel 110 may include disposing the touch sensor over the substrate SUB together with signal lines and electrodes related to driving the display device 100.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing technique or a mutual-capacitance sensing technique.

In the example where the touch sensing circuit performs touch sensing in the self-capacitance sensing technique, the touch sensing circuit can perform touch sensing based on capacitance between each touch electrode and a touch object (e.g., a finger, a pen, and the like). According to the self-capacitance sensing technique, each of the plurality of touch electrodes can serve as both a driving touch electrode and a sensing touch electrode. The touch driving circuit 260 can drive all, or one or more, of the plurality of touch electrodes and sense all, or one or more, of the plurality of touch electrodes.

In the example where the touch sensing circuit performs touch sensing in the mutual-capacitance sensing technique, the touch sensing circuit can perform touch sensing based on capacitance between touch electrodes. According to the mutual-capacitance sensing technique, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

The display device 100 according to aspects of the present disclosure may represent, but not limited to, a mobile terminal such as a smart phone, a tablet, or the like, a monitor, a television (TV), or the like. Such devices may be of various types, sizes, and shapes. The display device 100 according to embodiments of the present disclosure are not limited thereto, and may include displays of various types, sizes, and shapes for displaying information or images.

As described above, the display area DA of the display panel 110 may include the normal area NA and the one or more optical areas (OA1 and/or OA2) as illustrated in FIGS. 1A, 1B, and 1C. The normal area NA and the one or more optical areas (OA1 and/or OA2) may be areas where one or more images are allowed to be displayed. It should be noted here that the normal NA may be an area in which a light transmission structure need not be implemented, and the one or more optical areas (OA1 and/or OA2) may be areas in which it is beneficial to have a light transmission structure implemented.

As discussed above with respect to the examples of FIGS. 1A, 1B, and 1C, even though the display area DA of the display panel 110 may include the one or more optical areas (OA1 and/or OA2) together with the normal area NA, for convenience of description, discussions that follow will be provided based on embodiments where the display area DA includes both the first and second optical areas OA1 and OA2 (e.g., the first optical area OA1 of FIGS. 1A, 1B, and 1C, and the second optical area OA2 of FIGS. 1B and 1C) and the normal area NA (e.g., the normal area NA of FIGS. 1A, 1B, and 1C).

Figure 3:
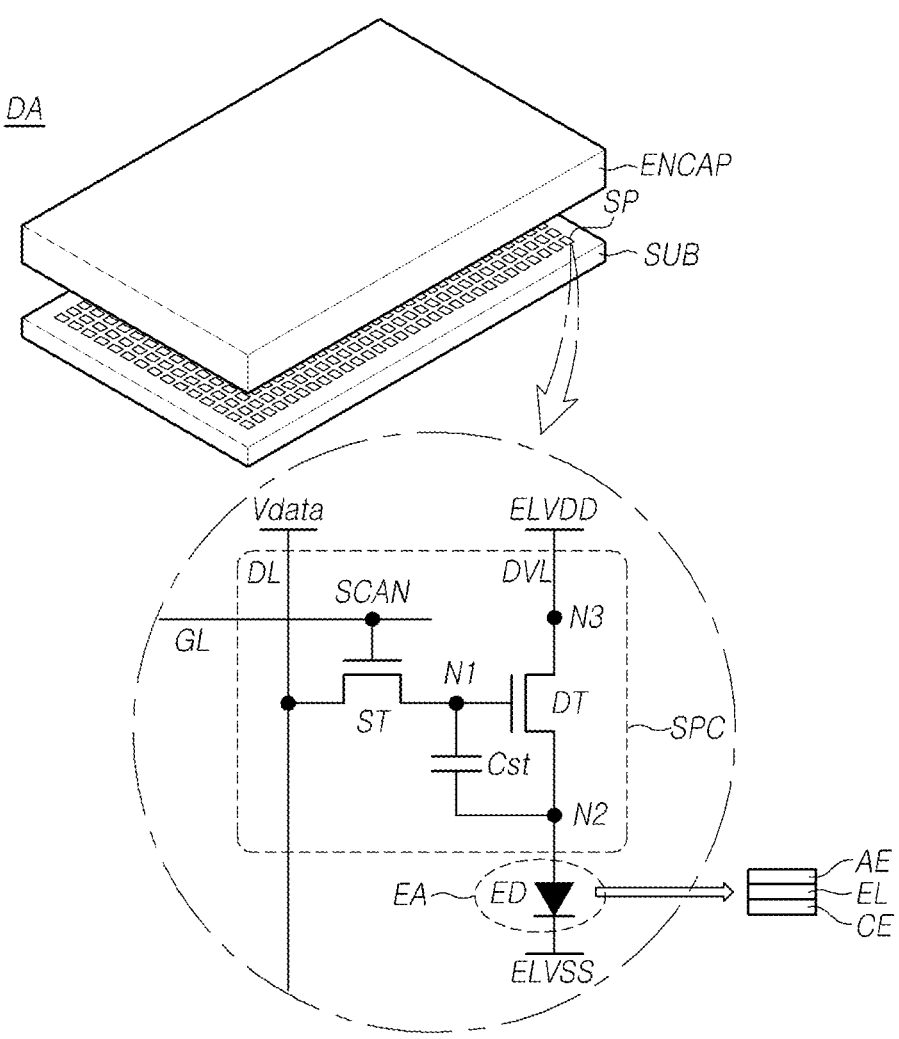
FIG. 3 illustrates an example display panel according to aspects of the present disclosure.

FIG. 3 illustrates an example system configuration of the display device 100 according to aspects of the present disclosure.

Referring to FIG. 3, a plurality of subpixels SP may be disposed in the display area DA of the display panel 110. The plurality of subpixels SP may be disposed in a normal area (e.g., the normal area of FIGS. 1A, 1B, and 1C), a first optical area (e.g., the first optical area OA1 of FIGS. 1A, 1B, and 1C), and a second optical area (e.g., the second optical area OA2 of FIGS. 1B and 1C) included in the display area DA of the display panel 110.

Referring to FIG. 3, each of the plurality of subpixels SP may include a light emitting element ED and a pixel circuit SPC configured to drive the light emitting element ED.

Referring to FIG. 3, the pixel circuit SPC may include a driving transistor DT for driving the light emitting element ED, a scan transistor ST for transmitting a data voltage Vdata to a first node N1 of the driving transistor DT, a storage capacitor Cst for maintaining a voltage at an approximate constant level during one frame, and the like.

The driving transistor DT may include the first node N1 to which a data voltage is applied, a second node N2 electrically connected to the light emitting element ED, and a third node N3 to which a driving voltage ELVDD through a driving voltage line DVL is applied. In the driving transistor DT, the first node N1 may be a gate node, the second node N2 may be a source node or a drain node, and the third node N3 may be the drain node or the source node. For convenience of description, descriptions that follow will be provided based on examples where the first, second and third nodes (N1, N2 and N3) of the driving transistor DT are gate, source and drain nodes, respectively, unless explicitly stated otherwise. However, it should be understood that the scope of the present disclosure includes examples where the first, second and third nodes (N1, N2 and N3) of the driving transistor DT are gate, drain and source nodes, respectively.

The light emitting element ED may include an anode electrode AE, an emission layer EL, and a cathode electrode CE. The anode electrode AE may represent a pixel electrode disposed in each subpixel SP, and may be electrically connected to the second node N2 of the driving transistor DT of each subpixel SP. The cathode electrode CE may represent a common electrode being common to the plurality of subpixels SP, and a base voltage ELVSS such as a low-level voltage may be applied to the cathode electrode CE.

For example, the anode electrode AE may be a pixel electrode, and the cathode electrode CE may be a common electrode. In another example, the anode electrode AE may be a common electrode, and the cathode electrode CE may be a pixel electrode. For convenience of description, discussions that follow will be provided based on examples where the anode electrode AE is a pixel electrode, and the cathode electrode CE is a common electrode unless explicitly stated otherwise. However, it should be understood that the scope of the present disclosure includes examples where the anode electrode AE is a common electrode, and cathode electrode CE is a pixel electrode.

The light emitting element ED may include a light emitting area EA having a predetermined size or area. The light emitting area EA of the light emitting element ED may be defined as, for example, an area in which the anode electrode AE, the emission layer EL, and the cathode electrode CE overlap one another.

The light emitting element ED may be, for example, an organic light emitting diode (OLED), an inorganic light emitting diode, a quantum dot light emitting element, or the like. In an embodiment where an organic light emitting diode (OLED) is used as the light emitting element ED, the emission layer EL thereof may include an organic emission layer including an organic material.

The scan transistor ST can be turned on and off by a scan signal SCAN that is a gate signal applied through a gate line GL, and be electrically connected between the first node N1 of the driving transistor DT and a data line DL.

The storage capacitor Cst may be electrically connected between the first node N1 and the second node N2 of the driving transistor DT.

The pixel circuit SPC may be configured with two transistors (2T: DT and ST) and one capacitor (1C: Cst) (which may be referred to as a "2T1C structure") as shown in FIG. 3, and in some implementations, may further include one or more transistors, and/or further include one or more capacitors.

In one or more embodiments, the storage capacitor Cst, which may be present between the first node N1 and the second node N2 of the driving transistor DT, may be an external capacitor intentionally configured or designed to be located outside of the driving transistor DT, other than internal capacitors, such as parasitic capacitors (e.g., a gate-to-source capacitance Cgs, a gate-to-drain capacitance Cgd, and the like). Each of the driving transistor DT and the scan transistor ST may be an n-type transistor or a p-type transistor.

Since circuit elements (e.g., in particular, a light emitting element ED, which is implemented with an organic light emitting diode including an organic material) included in each subpixel SP are vulnerable to external moisture or oxygen, an encapsulation layer ENCAP may be disposed in the display panel 110 in order to prevent external moisture or oxygen from penetrating into such circuit elements. The encapsulation layer ENCAP may be disposed such that it covers the light emitting element ED.

Hereinafter, for convenience of description, the term "optical area OA" is used instead of distinctly describing the first optical area OA1 and the second optical area OA2 described above. Thus, it should be noted that an optical area described below may represent any one or both of the first and second optical area OA1 and OA2 described above, unless explicitly stated otherwise.

Likewise, for convenience of description, the term "optical electronic device" is used instead of distinctly describing the first optical electronic device 11 and the second optical electronic device 12 described above. Thus, it should be noted that an optical electronic device described below may represent any one or both of the first and second optical electronic device 11 and 12 described above, unless explicitly stated otherwise.

Hereinafter, a first type optical area OA will be described with reference to FIGS. 4 to 9, and a second type optical area OA will be described with reference to FIGS. 10 to 12.

The first type optical area OA and the second type optical area OA are briefly described as follows.

In the case of the first type optical area OA, one or more pixel circuits SPC for driving one or more light emitting elements ED disposed in the optical area OA may be disposed in an area outside of the optical area OA without being in the optical area OA.

In the case of the second type optical area OA, one or more pixel circuits SPC for driving one or more light emitting elements ED disposed in the optical area OA may be disposed in the optical area OA.

Figure 4:
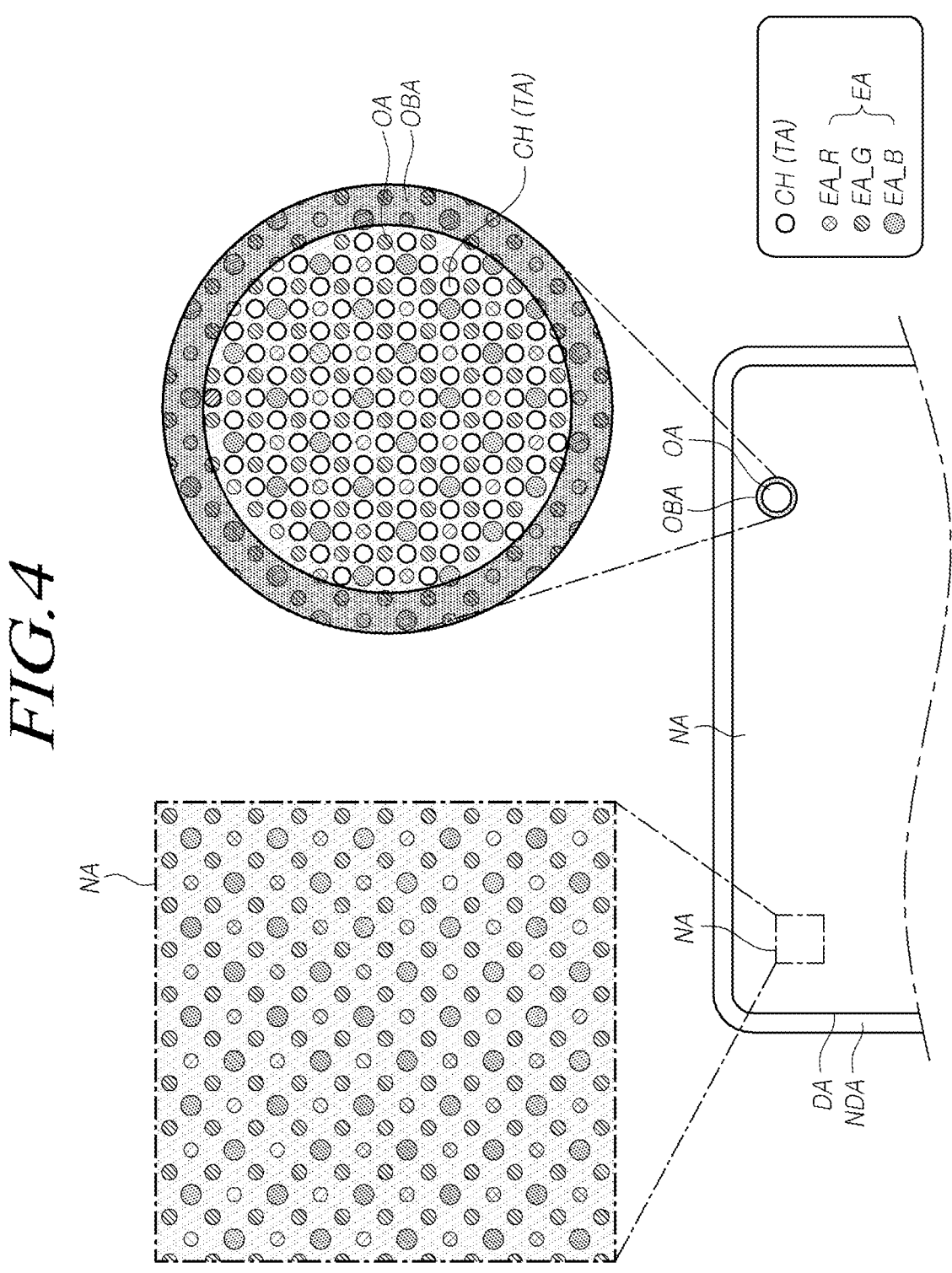
FIG. 4 schematically illustrates an example first type optical area and an example normal area around the first type optical area in the display panel according to aspects of the present disclosure.

FIG. 4 schematically illustrates an example first type optical area OA and an example normal area NA around the first type optical area OA in the display panel 110 according to aspects of the present disclosure.

Referring to FIG. 4, in one or more aspects, the display panel 110 may include the display area DA where one or more images can be displayed and the non-display area NDA where an image is not displayed.

Referring to FIG. 4, the display area DA may include the optical area OA through which light can be transmitted, and the normal area NA around the optical area OA.

The optical area OA in FIG. 4 may be defined as a first type structure. Thus, in the example where the optical area OA is configured with the first type, an optical bezel area OBA may be disposed outside of the optical area OA. In one or more embodiments, the optical bezel area OBA may represent a part of the normal area NA.

In other words, when the optical area OA is configured with the first type, the display area DA may include the optical area OA, the normal area NA located outside of the optical area OA, and the optical bezel area OBA between the optical area OA and the normal area NA.

Referring to FIG. 4, the optical area OA may be an area overlapping an optical electronic device and be a transmittable area through which light used for operation of the optical electronic device can be transmitted.

The light passing through the optical area OA may include light of a single wavelength band or light of various wavelength bands. For example, the optical area OA may be configured to allow, but not limited to, at least one of visible light, infrared light, ultraviolet light, and the like to be transmitted.

The optical electronic device can receive light passing through the optical area OA and perform a predefined operation using the received light. The light received by the optical electronic device through the optical area OA may include at least one of visible light, infrared light, and ultraviolet light.

For example, in an example where the optical electronic device is a camera, the light used for the predefined operation of the optical electronic device, which has passed through the optical area OA, may include visible light.

In another example, in an example where the optical electronic device is an infrared sensor, the light used for the predefined operation of the optical electronic device, which has passed through the optical area OA, may include infrared (also referred to as infrared light).

Referring to FIG. 4, the optical bezel area OBA may represent an area located outside of the optical area OA. The normal area NA may represent an area located outside of the optical bezel area OBA. The optical bezel area OBA may be disposed between the optical area OA and the normal area NA.

For example, the optical bezel area OBA may be disposed outside of only a portion of an edge of the optical area OA, or disposed outside of the entire edge of the optical area OA.

In the example where the optical bezel area OBA is disposed outside of the entire edge of the optical area OA, the optical bezel area OBA may have a ring shape surrounding the optical area OA.

For example, the optical area OA may have various shapes such as a circular shape, an elliptical shape, a polygonal shape, an irregular shape, or the like. The optical bezel area OBA may have various ring shapes (e.g., a circular ring shape, an elliptical ring shape, a polygonal ring shape, an irregular ring shape, or the like) surrounding the optical area OA having various shapes.

Referring to FIG. 4, the display area DA may include a plurality of light emitting areas EA. As the optical area OA, the optical bezel area OBA, and the normal area NA are areas included in the display area DA, each of the optical area OA, the optical bezel area OBA, and the normal area NA may include a plurality of light emitting areas EA.

For example, the plurality of light emitting areas EA may include a first color light emitting area emitting light of a first color, a second color light emitting area emitting light of a second color, and a third color light emitting area emitting light of a third color.

At least one of the first color light emitting area, the second color light emitting area, and the third color light emitting area may have a different area or size from the rest thereof.

The first color, the second color, and the third color may be different colors from one another, and may be various colors. For example, the first color, second color, and third color may be or include red, green, and blue, respectively.

Hereinafter, for convenience of description, the first color, the second color, and the third color are considered to be red, green, and blue, respectively. However, embodiments of the present disclosure are not limited thereto.

In the example where the first color, the second color, and the third color are red, green, and blue, respectively, an area of a blue light emitting area EA_B may be the largest among an area of a red light emitting area EA_R, an area of a green light emitting area EA_G, and the area of the blue light emitting area EA_B.

A light emitting element ED disposed in the red light emitting area EA_R may include an emission layer EL emitting red light. A light emitting element ED disposed in the green light emitting area EA_G may include an emission layer EL emitting green light. A light emitting element ED disposed in the blue light emitting area EA_B may include an emission layer EL emitting blue light.

Among the emission layer EL emitting red light, the emission layer EL emitting green light, and the emission layer EL emitting blue light, an organic material included in the emission layer EL emitting blue light may be most easily degraded in terms of material.

In one or more embodiments, as the blue light emitting area EA_B is configured or designed to have the largest area or size, current density supplied to the light emitting element ED disposed in the blue light emitting area EA_B may be the least. Therefore, a degradation degree of a light emitting element ED disposed in the blue light emitting area EA_B may be similar to a degradation degree of a light emitting element ED disposed in the red light emitting area EA_R and a degradation degree of a light emitting element ED disposed in the green light emitting area EA_G.

In consequence, a difference in degradation between the light emitting element ED disposed in the red light emitting area EA_R, the light emitting elements ED disposed in the green light emitting area EA_G, and the light emitting elements ED disposed in the blue light emitting area EA_B cannot be produced or can be reduced, and therefore, the display device 100 or the display panel 110 according to aspects of the present disclosure can provide an advantage of improving image quality. In addition, as a difference in degradation between the light emitting element ED disposed in the red light emitting area EA_R, the light emitting elements ED disposed in the green light emitting area EA_G, and the light emitting elements ED disposed in the blue light emitting area EA_B is eliminated or reduced, the display device 100 or the display panel 110 according to aspects of the present disclosure can therefore provide an advantage of reducing a difference in lifespan between the light emitting element ED disposed in the red light emitting area EA_R, the light emitting elements ED disposed in the green light emitting area EA_G, and the light emitting elements ED disposed in the blue light emitting area EA_B.

Referring to FIG. 4, it is beneficial that the optical area OA, which is a transmittable area, has high transmittance. To meet this requirement, a cathode electrode (e.g., the cathode electrode CE of FIG. 3) may include a plurality of cathode holes CH in the optical area OA. That is, in the optical area OA, the cathode electrode CE may include a plurality of cathode holes CH.

Referring to FIG. 4, in one or more embodiments, the cathode electrode CE may not include a cathode hole CH in the normal area NA. That is, in the normal area NA, the cathode electrode CE may not include a cathode hole CH.

In one or more embodiments, the cathode electrode CE may not include a cathode hole CH in the optical bezel area OBA. That is, in the optical bezel area OBA, the cathode electrode CE may not include a cathode hole CH.

In the optical area OA, the plurality of cathode holes CH formed in the cathode electrode CE may be referred to as a plurality of transmission areas TA or a plurality of opening areas. Although FIG. 4 illustrates that each cathode hole CH has a respective circular shape, one or more cathode holes CH may have various shapes other than the circular shape, such as an elliptical shape, a polygonal shape, an irregular shape or the like.

Figure 5:
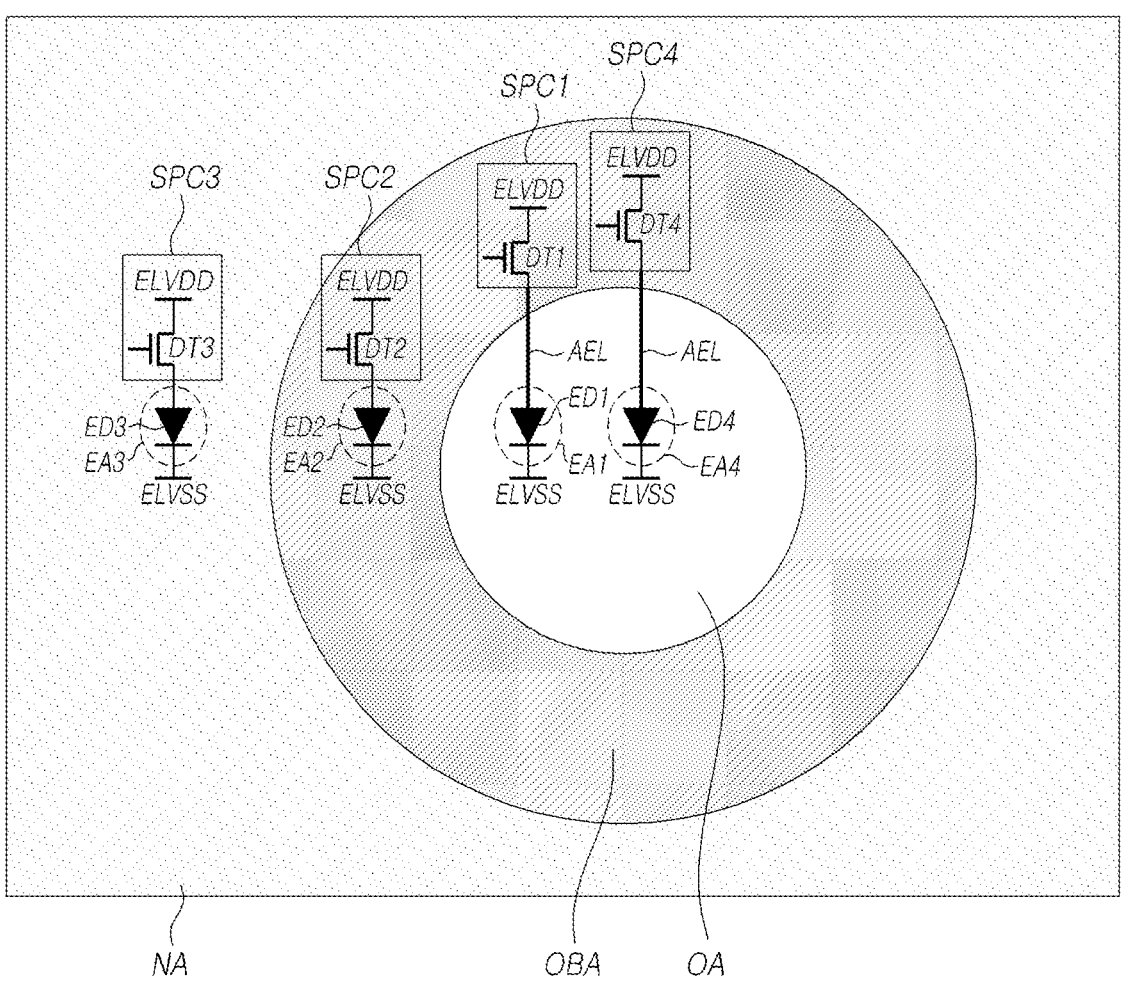
FIGS. 5 and 6 illustrate example light emitting elements and example pixel circuits for driving the light emitting elements, which are disposed in a normal area, an optical bezel area, and an optical area in the display panel according to aspects of the present disclosure.

FIG. 5 illustrates an example configuration of the display panel 110 according to aspects of the present disclosure. As illustrated in FIG. 5, the display panel 110 may include light emitting elements (ED1, ED2, ED3, and ED4) disposed in the normal area NA, the optical bezel area OBA, and the optical area OA, and pixel circuits (SPC1, SPC2, SPC3, and SPC4) for driving the light emitting elements (ED1, ED2, ED3, and ED4).

It should be understood here that each of the pixel circuits (SPC1, SPC2, SPC3, and SPC4) may include transistors (DT and ST), a storage capacitor Cst, and the like as shown in FIG. 3. However, it should be noted that for convenience of explanation, each of the pixel circuits (SPC1, SPC2, SPC3, and SPC4) is simply expressed as only a respective driving transistor (DT1, DT2, DT3, and DT4).

Referring to FIG. 5, the normal area NA, the optical area OA, and the optical bezel area OBA may have structural differences as well as positional differences.

As one example of such structural differences, one or more pixel circuits (SPC1, SPC2, SPC3, and/or SPC4) may be disposed in the optical bezel area OBA and the normal area NA, but a pixel circuit may not be disposed in the optical area OA. For example, the optical bezel area OBA and the normal area NA may be configured to allow one or more transistors (DT1, DT2, DT3, and/or DT4) to be disposed therein, and the optical area OA may be configured not to allow a transistor to be disposed therein.

Transistors and storage capacitors included in the pixel circuits (SPC1, SPC2, SPC3, and SPC4) may be components causing transmittance to be reduced. Thus, since a pixel circuit (e.g., SPC1, SPC2, SPC3, or SPC4) is not disposed in the optical area OA, the transmittance of the optical area OA can be more improved.

In one or more embodiments, although the pixel circuits (SPC1, SPC2, SPC3, and SPC4) may be disposed only in the normal area NA and the optical bezel area OBA, the light emitting elements (ED1, ED2, ED3, and ED4) may be disposed in the normal area NA, the optical bezel area OBA, and the optical area OA.

Referring to FIG. 5, although a first light emitting element ED1 may be disposed in the optical area OA, a first pixel circuit SPC1 for driving the first light emitting element ED1 may not be located in the optical area OA.

Referring to FIG. 5, the first pixel circuit SPC1 for driving the first light emitting element ED1 disposed in the optical area OA may be disposed in the optical bezel area OBA, not in the optical area OA.

Hereinafter, the normal area NA, the optical area OA, and the optical bezel area OBA will be described in more detail.

Referring to FIG. 5, in one or more embodiments, the plurality of light emitting areas EA included in the display panel 110 according to aspects of the present disclosure may include a first light emitting area EA1, a second light emitting area EA2, and a third light emitting area EA3. In these embodiments, the first light emitting area EA1, the second light emitting area EA2, and the third light emitting area EA3 may be included in the optical area OA, the optical bezel area OBA, and the normal area NA, respectively. Hereinafter, it is assumed that the first light emitting area EA1, the second light emitting area EA2, and the third light emitting area EA3 are areas emitting light of a same color.

Referring to FIG. 5, in one or more embodiments, the display panel 110 according to aspects of the present disclosure may include: a first light emitting element ED1 disposed in the optical area OA and having the first light emitting area EA1; a second light emitting element ED2 disposed in the optical bezel area OBA and having the second light emitting area EA2; and a third light emitting element ED3 disposed in the normal area NA and having the third light emitting area EA3.

Referring to FIG. 5, in one or more embodiments, the display panel 110 according to aspects of the present disclosure may further include a first pixel circuit SPC1 configured to drive the first light emitting element ED1, a second pixel circuit SPC2 configured to drive the second light emitting element ED2, and a third pixel circuit SPC3 configured to drive the third light emitting element ED3.

Referring to FIG. 5, the first pixel circuit SPC1 may include a first driving transistor DT1. The second pixel circuit SPC2 may include a second driving transistor DT2. The third pixel circuit SPC3 may include a third driving transistor DT3.

Referring to FIG. 5, in one or more embodiments, in the display panel 110 according to aspects of the present disclosure, the second pixel circuit SPC2 may be located in the optical bezel area OBA where the second light emitting element ED2 corresponding to the second pixel circuit SPC2 is disposed, and the third pixel circuit SPC3 may be located in the normal area NA where the third light emitting element ED3 corresponding to the third pixel circuit SPC3 is disposed.

Referring to FIG. 5, in one or more embodiments, in the display panel 110 according to aspects of the present disclosure, the first pixel circuit SPC1 may not be located in the optical area OA where the first light emitting element ED1 corresponding to the first pixel circuit SPC1 is disposed, and instead, may be located in the optical bezel area OBA located outside of the optical area OA. As a result, the transmittance of the optical area OA can be improved.

Referring to FIG. 5, in one or more embodiments, the display panel 110 according to aspects of the present disclosure may further include an anode extension line AEL electrically connecting the first light emitting element ED1 disposed in the optical area OA to the first pixel circuit SPC1 disposed in the optical bezel area OBA.

The anode extension line AEL may electrically extend or connect an anode electrode AE of the first light emitting element ED1 to a second node N2 of the first driving transistor DT1 in the first pixel circuit SPC1.

As described above, in the display panel 110 according to aspects of the present disclosure, the first pixel circuit SPC1 for driving the first light emitting element ED1 disposed in the optical area OA may be disposed in the optical bezel area OBA, not in the optical area OA. Such a structure may be referred to as an anode extension structure. Thus, the first type of the optical area OA is also referred to as an anode extension type.

In an embodiment where the display panel 110 according to aspects of the present disclosure has such an anode extension structure, all or a portion of the anode extension line AEL may be disposed in optical area OA, and the anode extension line AEL may include a transparent material, or be or include a transparent line. Accordingly, even when the anode extension line AEL for connecting the first pixel circuit SPC1 to the first light emitting element ED1 is disposed in the optical area OA, the display device 100 or the display panel 110 according to aspects of the present disclosure can prevent the transmittance of the optical area OA from being reduced.

Referring to FIG. 5, a plurality of light emitting areas EA may further include a fourth light emitting area EA4 emitting light of the same color as the first light emitting area EA1 and included in the optical area OA.

Referring to FIG. 5, the fourth light emitting area EA4 may be disposed adjacent to the first light emitting area EA1 in a row direction or a column direction.

Referring to FIG. 5, in one or more embodiments, the display panel 110 according to aspects of the present disclosure may further include a fourth light emitting element ED4 disposed in the optical area OA and having the fourth light emitting area EA4, and a fourth pixel circuit SPC4 configured to drive the fourth light emitting element ED4.

Referring to FIG. 5, the fourth pixel circuit SPC4 may include a fourth driving transistor DT4. For convenience of description, a scan transistor ST and a storage capacitor Cst included in the fourth pixel circuit SPC4 are omitted from FIG. 5.

Referring to FIG. 5, although the fourth pixel circuit SPC4 is a circuit for driving the fourth light emitting element ED4 disposed in the optical area OA, the fourth pixel circuit SPC4 may be disposed in the optical bezel area OBA.

Referring to FIG. 5, in one or more embodiments, the display panel 110 according to aspects of the present disclosure may further include an anode extension line AEL for electrically connecting the fourth light emitting element ED4 to the fourth pixel circuit SPC4.

All or a portion of the anode extension line AEL may be disposed in the optical area OA, and the anode extension line AEL may include a transparent material, or be or include a transparent line.

As described above, the first pixel circuit SPC1 disposed in the optical bezel area OBA may be configured to drive one light emitting element ED1 disposed in the optical area OA. Such a circuit connection scheme may be referred to as a one-to-one (1:1) circuit connection scheme.

As a result, the number of pixel circuits SPC disposed in the optical bezel area OBA may be increased significantly. Further, the structure of the optical bezel area OBA may become complicated, and an aperture ratio (or a light emitting area) of the optical bezel area OBA may be reduced.

In order to increase the aperture ratio (or the light emitting area) of the optical bezel area OBA while having an anode extension structure, in one or more embodiments, the display device 100 according to aspects of the present disclosure may be configured in a 1:N (where N is 2 or more) circuit connection scheme.

According to the 1:N circuit connection scheme, the first pixel circuit SPC1 disposed in the optical bezel area OBA may be configured to drive two light emitting elements ED disposed in the optical area OA simultaneously or together.

Figure 6:
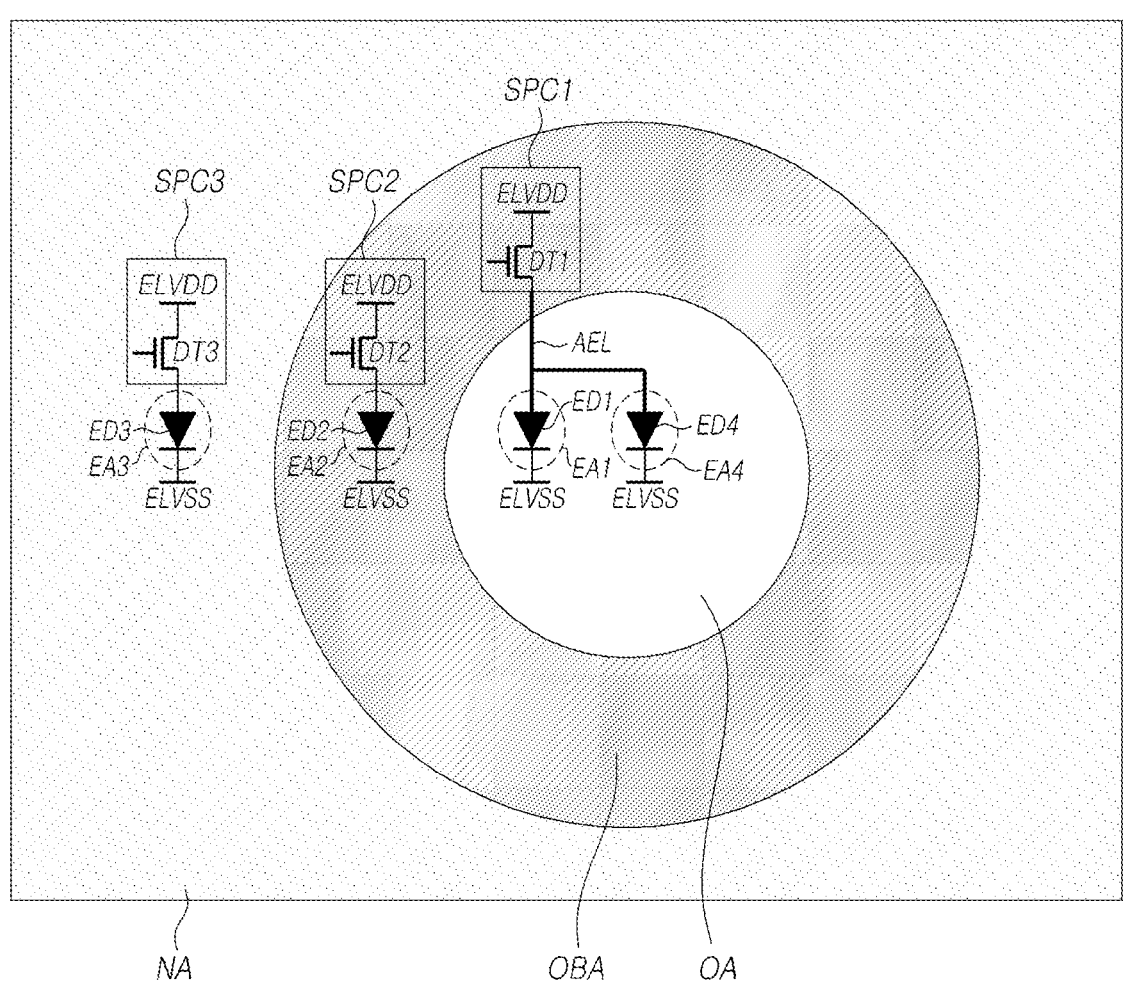

FIG. 6 illustrates an example based on a 1:2 circuit connection scheme for convenience of description. In this example, a first pixel circuit SPC1 disposed in the optical bezel area OBA may be configured to drive two or more light emitting elements (ED1 and ED4) disposed in the optical area OA simultaneously or together.

FIG. 6 illustrates an example configuration of the display panel 110 according to aspects of the present disclosure. As illustrated in FIG. 6, the display panel 110 may include light emitting elements (ED1, ED2, ED3, and ED4) disposed in the normal area NA, the optical bezel area OBA, and the optical area OA, and pixel circuits (SPC1, SPC2, and SPC3) for driving the light emitting elements (ED1, ED2, ED3, and ED4).

Referring to FIG. 6, a fourth light emitting element ED4 disposed in the optical area OA can be driven by the first pixel circuit SPC1 for driving a first light emitting element ED1 located in the optical area OA. That is, the first pixel circuit SPC1 disposed in the optical bezel area OBA may be configured to drive the first light emitting element ED1 and the fourth light emitting element ED4 disposed in the optical area OA together or substantially simultaneously.

Accordingly, even when the display panel 110 has an anode extension structure, the number of pixel circuits SPC disposed in the optical bezel area OBA can be reduced, and thereby, an opening area and a light emitting area of the optical bezel area OBA can be increased.

In the example of FIG. 6, the first light emitting element ED1 and the fourth light emitting element ED4 driven together by the first pixel circuit SPC1 disposed in the optical bezel area OBA may be light emitting elements that emit light of a same color, and are adjacent to each other in a row direction or a column direction.

Referring to FIG. 6, an anode extension line AEL may connect the first light emitting element ED1 and the fourth light emitting element ED4 disposed in the optical area OA to the first pixel circuit SPC1 disposed in the optical bezel area OBA.

Figure 7:
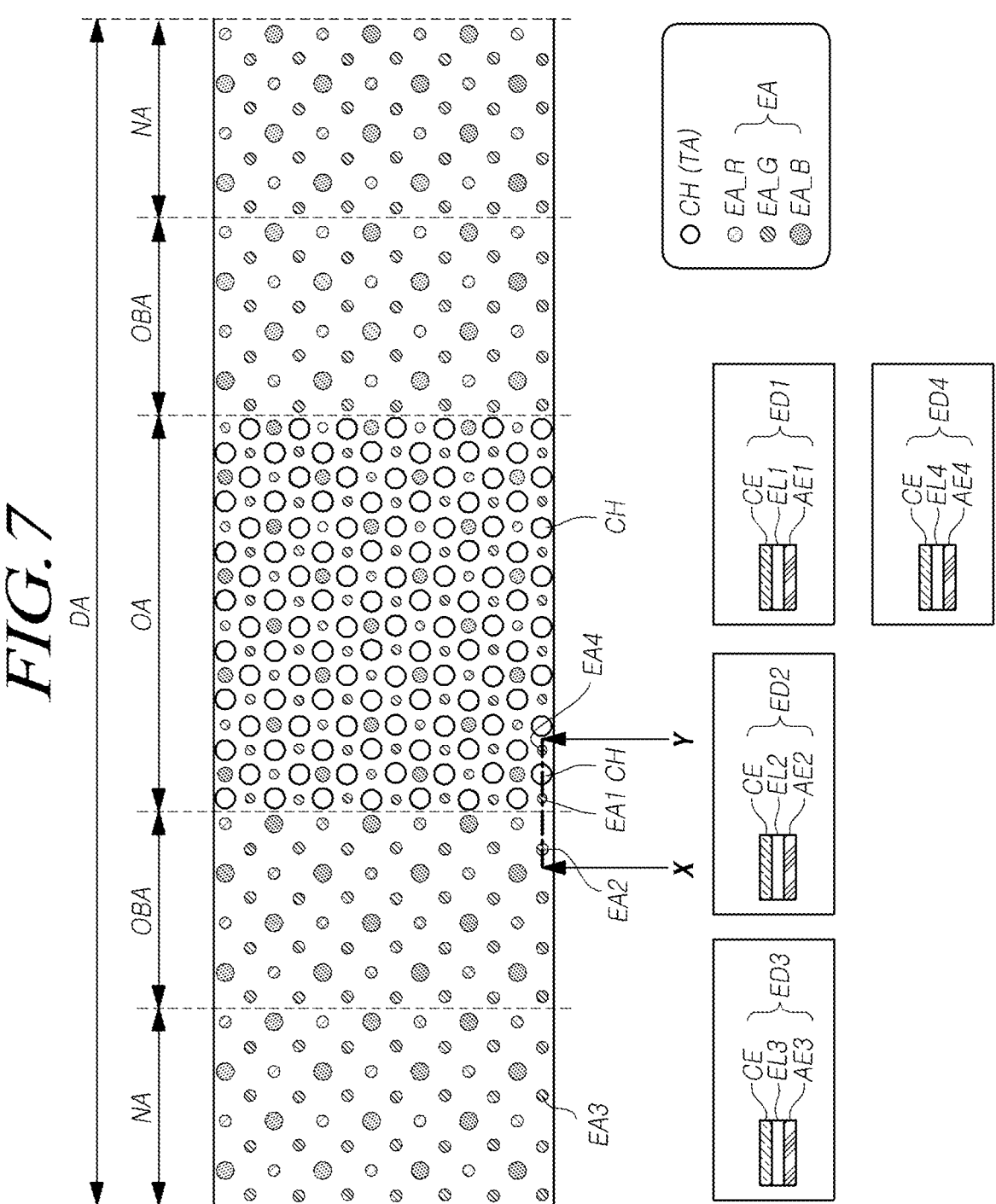
FIG. 7 is an example plan view of the normal area, the optical bezel area, and the optical area in the display panel according to aspects of the present disclosure.

FIG. 7 is an example plan view of the normal area NA, the optical bezel area OBA, and the optical area OA in the display panel 110 according to aspects of the present disclosure.

Referring to FIG. 7, in the display panel 110 according to aspects of the present disclosure, a plurality of light emitting areas EA disposed in each of the normal area NA, the optical bezel area OBA, and the optical area OA may include a red light emitting area EA_R, a green light emitting area EA_G, and a blue light emitting area EA_B.

Referring to FIG. 7, in the display panel 110 according to aspects of the present disclosure, a cathode electrode (e.g., the cathode electrode CE of FIG. 3) may be commonly disposed in the normal area NA, the optical bezel area OBA, and the optical area OA.

The cathode electrode CE may include a plurality of cathode holes CH, and the plurality of cathode holes CH of the cathode electrode CE may be disposed in the optical area OA.

The normal area NA and the optical bezel area OBA may be areas through which light cannot be transmitted, and the optical area OA may be an area through which light can be transmitted. Accordingly, the transmittance of the optical area OA may be higher than respective transmittance of the optical bezel area OBA and the normal area NA.

All of the optical area OA may be an area through which light can be transmitted, and the plurality of cathode holes CH of the optical area OA may be transmission areas TA through which light can be transmitted more effectively. For example, the remaining area except for the plurality of cathode holes CH in the optical area OA may be an area through which light can be transmitted, and respective transmittance of the plurality of cathode holes CH in the optical area OA may be higher than the transmittance of the remaining area except for the plurality of cathode holes CH in the optical area OA.

In another example, the plurality of cathode holes CH in the optical area OA may be transmission areas TA through which light can be transmitted, and the remaining area except for the plurality of cathode holes CH in the optical area OA may be an area through which light cannot be transmitted.

Referring to FIG. 7, the arrangement of light emitting areas EA in the optical area OA, the arrangement of light emitting areas EA in the optical bezel area OBA, and the arrangement of light emitting areas EA in the normal area NA may be the same as one another.

Referring to FIG. 7, a plurality of light emitting areas EA may include a first light emitting area EA1 included in the optical area OA, a second light emitting area EA2 included in the optical bezel area OBA and emitting light of the same color as the first light emitting area EA1, and a third light emitting area EA3 included in the normal area NA and emitting light of the same color as the first light emitting area EA1.

Referring to FIG. 7, the plurality of light emitting areas EA may further include a fourth light emitting area EA4 included in the optical area OA and emitting light of the same color as the first light emitting area EA1.

Referring to FIG. 7, in one or more embodiments, the display panel 110 according to aspects of the present disclosure may include a first anode electrode AE1 disposed in the optical area OA, a second anode electrode AE2 disposed in the optical bezel area OBA, a third anode electrode AE3 disposed in the normal area NA, and a fourth anode electrode AE4 disposed in the optical area OA.

In one or more embodiments, the display panel 110 according to aspects of the present disclosure may further include a cathode electrode (e.g., the cathode electrode CE in FIG. 3) commonly disposed in the normal area NA, the optical bezel area OBA, and the optical area OA.

In one or more embodiments, the display panel 110 according to aspects of the present disclosure may include a first emission layer EL1 disposed in the optical area OA, a second emission layer EL2 disposed in the optical bezel area OBA, a third emission layer EL3 disposed in the normal area NA, and a fourth emission layer EL4 disposed in the optical area OA.

The first to fourth emission layers EL1 to EL4 may be emission layers emitting light of a same color. In these embodiments, the first to fourth emission layers EL1 to EL4 may be disposed as separate emission layers or be integrated into a single emission layer.

Referring to FIG. 7, light emitting elements of the display panel 110 according to aspects of the present disclosure may be configured such that: the first light emitting element ED1 is configured with the first anode electrode AE1, the first emission layer EL1, and the cathode electrode CE; the second light emitting element ED2 is configured with the second anode electrode AE2, the second emission layer EL2, and the cathode electrode CE; the third light emitting element ED3 is configured with the third anode electrode AE3, the third emission layer EL3, and the cathode electrode CE; and the fourth light emitting element ED4 is configured with the fourth anode electrode AE4, the fourth emission layer EL4, and the cathode electrode CE.

Hereinafter, a cross-sectional structure taken along line X-Y of FIG. 7 will be discussed in more detail with reference to FIGS. 8 and 9.

A portion indicated by line X-Y in FIG. 7 includes a portion of the optical bezel area OBA and a portion of the optical area OA with respect to the boundary between the optical bezel area OBA and the optical area OA.

The portion indicated by line X-Y in FIG. 7 may include the first light emitting area EA1 and the fourth light emitting area EA4 included in the optical area OA, and the second light emitting area EA2 included in the optical bezel area OBA. The first light emitting area EA1, the fourth light emitting area EA4, and the second light emitting area EA2 may represent light emitting areas EA emitting light of a same color.

Figure 8:
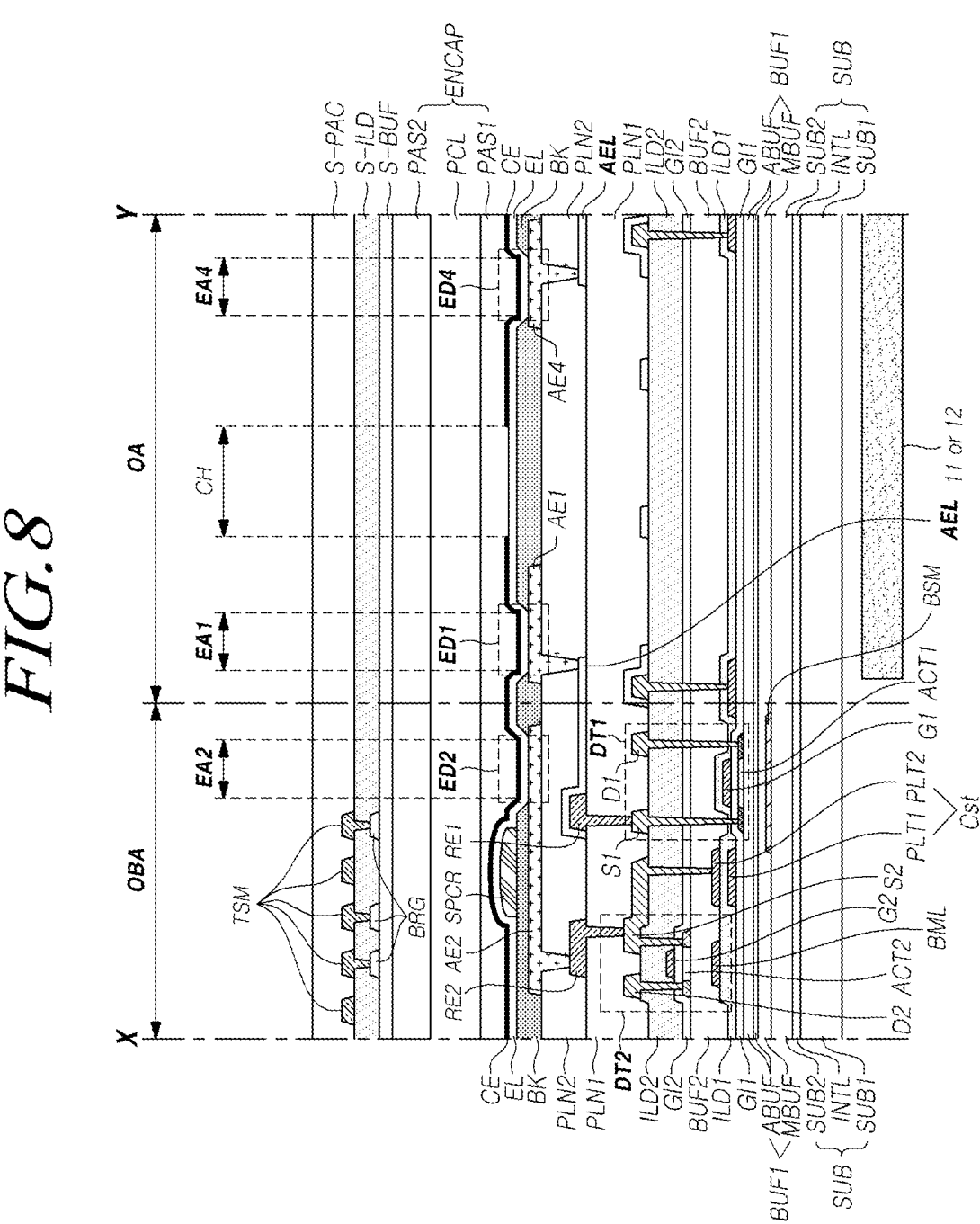
FIGS. 8 and 9 are example cross-sectional views of the optical bezel area and the optical area in the display panel according to aspects of the present disclosure.

FIG. 8 illustrates an example cross-sectional view of the display panel 110 according to aspects of the present disclosure, and more specifically, illustrates example cross-sectional views in the optical bezel area OBA and the optical area OA of the display panel 110. It should be noted here that FIG. 8 illustrates cross-sectional views based on the application of a 1:1 circuit connection scheme, as in FIG. 5.

Referring to FIG. 8, in terms of stackup configuration, the display panel 110 may include a transistor forming part, a light emitting element forming part, and an encapsulation part.

The transistor forming part may include a substrate SUB, a first buffer layer BUF1 on the substrate SUB, various types of transistors DT1 and DT2 formed on the first buffer layer BUF1, a storage capacitor Cst, and various electrodes and signal lines.

The substrate SUB may include, for example, a first substrate SUB1 and a second substrate SUB2, and may include an intermediate layer INTL interposed between the first substrate SUB1 and the second substrate SUB2. In this example, the intermediate layer INTL may be an inorganic layer and may serve to prevent moisture permeation.

A lower shield metal BSM may be disposed over the substrate SUB. The lower shield metal BSM may be located under a first active layer ACT1 of a first driving transistor DT1.

The first buffer layer BUF1 may include a stack of a single layer or a stack of multiple layers. In an example where the first buffer layer BUF1 includes a stack of multilayer, the first buffer layer BUF1 may include a multi-buffer layer MBUF and an active buffer layer ABUF.

Various types of transistors (DT1, DT2, and the like), at least one storage capacitor Cst, and various electrodes or signal lines may be disposed on the first buffer layer BUF1.

For example, the transistors DT1 and DT2 formed on the first buffer layer BUF1 may include a same material, and be located in one or more same layers. In another example, as shown in FIG. 8, the first driving transistor DT1 and a second driving transistor DT2 among the transistors (DT1, DT2, and the like) may include different materials and be located in different layers.

Referring to FIG. 8, the first driving transistor DT1 may represent a driving transistor DT for driving the first light emitting element ED1 included in the optical area OA, and the second driving transistor DT2 may represent a driving transistor DT for driving the second light emitting element ED2 included in the optical bezel area OBA.

For example, the first driving transistor DT1 may represent a driving transistor included in the first pixel circuit SPC1 for driving the first light emitting element ED1 included in the optical area OA, and the second driving transistor DT2 may represent a driving transistor included in the second pixel circuit SPC2 for driving the second light emitting element ED2 included in the optical bezel area OBA.

Stackup configurations of the first driving transistor DT1 and the second driving transistor DT2 will be described below.

The first driving transistor DT1 may include the first active layer ACT1, a first gate electrode G1, a first source electrode S1, and a first drain electrode D1.

The second driving transistor DT2 may include a second active layer ACT2, a second gate electrode G2, a second source electrode S2, and a second drain electrode D2.

The second active layer ACT2 of the second driving transistor DT2 may be located in a higher location in the stackup configuration than the first active layer ACT1 of the first driving transistor DT1.

The first buffer layer BUF1 may be disposed under the first active layer ACT1 of the first driving transistor DT1, and the second buffer layer BUF2 may be disposed under the second active layer ACT2 of the second driving transistor DT2.

For example, the first active layer ACT1 of the first driving transistor DT1 may be located on the first buffer layer BUF1, and the second active layer ACT2 of the second driving transistor DT2 may be located on the second buffer layer BUF2. In this case, the second buffer layer BUF2 may be placed in a higher location than the first buffer layer BUF1.

The first active layer ACT1 of the first driving transistor DT1 may be disposed on the first buffer layer BUF1, and a first gate insulating layer GI1 may be disposed on the first active layer ACT1 of the first driving transistor DT1. The first gate electrode G1 of the first driving transistor DT1 may be disposed on the first gate insulating layer GI1, and a first interlayer insulating layer ILD1 may be disposed on the first gate electrode G1 of the first driving transistor DT1.

In this implementation, the first active layer ACT1 of the first driving transistor DT1 may include a first channel region overlapping the first gate electrode G1, a first source connection region located on one side of the first channel region, and a first drain connection region located on the other side of the first channel region.

The second buffer layer BUF2 may be disposed on the first interlayer insulating layer ILD1.

The second active layer ACT2 of the second driving transistor DT2 may be disposed on the second buffer layer BUF2, and a second gate insulating layer GI2 may be disposed on the second active layer ACT2. The second gate electrode G2 of the second driving transistor DT2 may be disposed on the second gate insulating layer GI2, and a second interlayer insulating layer ILD2 may be disposed on the second gate electrode G2.

In this implementation, the second active layer ACT2 of the second driving transistor DT2 may include a second channel region overlapping the second gate electrode G2, a second source connection region located on one side of the second channel region, and a second drain connection region located on the other side of the second channel region.

The first source electrode S1 and the first drain electrode D1 of the first driving transistor DT1 may be disposed on the second interlayer insulating layer ILD2. The second source electrode S2 and the second drain electrode D2 of the second driving transistor DT2 may be disposed on the second interlayer insulating layer ILD2.

The first source electrode S1 and the first drain electrode D1 of the first driving transistor DT1 may be respectively connected to the first source connection region and the first drain connection region of the first active layer ACT1 through through-holes formed in the second interlayer insulating layer ILD2, the second gate insulating layer GI2, the second buffer layer BUF2, the first interlayer insulating layer ILD1, and the first gate insulating layer GI1.

The second source electrode S2 and the second drain electrode D2 of the second driving transistor DT2 may be respectively connected to the second source connection region and the second drain connection region of the second active layer ACT2 through through-holes formed in the second interlayer insulating layer ILD2 and the second gate insulating layer GI2.

It should be understood that FIG. 8 illustrates only the second driving transistor DT2 and a storage capacitor Cst among circuit components included in the second pixel circuit SPC2, and other components such as one or more transistors, and the like are omitted. It should be also understood that FIG. 8 illustrates only the first driving transistor DT1 among circuit components included in the first pixel circuit SPC1, and other components such as one or more transistors, a storage capacitor, and the like are omitted.

Referring to FIG. 8, the storage capacitor Cst included in the second pixel circuit SPC2 may include a first capacitor electrode PLT1 and a second capacitor electrode PLT2.

The first capacitor electrode PLT1 may be electrically connected to the second gate electrode G2 of the second driving transistor DT2, and the second capacitor electrode PLT2 may be electrically connected to the second source electrode S2 of the second driving transistor DT2.

In one or more embodiments, referring to FIG. 8, a lower metal BML may be disposed under the second active layer ACT2 of the second driving transistor DT2. This lower metal BML may overlap all or a portion of the second active layer ACT2.

The lower metal BML may be, for example, electrically connected to the second gate electrode G2. In another example, the lower metal BML may serve as a light shield for shielding light traveling from a lower location than the lower metal BML. In this implementation, the lower metal BML may be electrically connected to the second source electrode S2.

Even though the first driving transistor DT1 is a transistor for driving the first light emitting element ED1 disposed in the optical area OA, the first driving transistor DT1 may be disposed in the optical bezel area OBA, not the optical area OA.

The second driving transistor DT2, which is a transistor for driving the second light emitting element ED2 disposed in the optical bezel area OBA, may be disposed in the optical bezel area OBA.

Referring to FIG. 8, a first planarization layer PLN1 may be disposed on the first driving transistor DT1 and the second driving transistor DT2. For example, the first planarization layer PLN1 may be located on the first source electrode S1 and the first drain electrode D1 of the first driving transistor DT1 and the second source electrode S2 and the second drain electrode D2 of the second driving transistor DT2.

Referring to FIG. 8, a first relay electrode RE1 and a second relay electrode RE2 may be disposed on the first planarization layer PLN1.

The first relay electrode RE1 may represent an electrode for relaying an electrical connection between the first source electrode S1 of the first driving transistor DT1 and a first anode electrode AE1 of the first light emitting element ED1. The second relay electrode RE2 may represent an electrode for relaying an electrical connection between the second source electrode S2 of the second driving transistor DT2 and a second anode electrode AE2 of the second light emitting element ED2.

The first relay electrode RE1 may be electrically connected to the first source electrode S1 of the first driving transistor DT1 through a hole formed in the first planarization layer PLN1. The second relay electrode RE2 may be electrically connected to the second source electrode S2 of the second driving transistor DT2 through another hole formed in the first planarization layer PLN1.

Referring to FIG. 8, the first relay electrode RE1 and the second relay electrode RE2 may be disposed in the optical bezel area OBA.

Referring to FIG. 8, an anode extension line AEL may be connected to the first relay electrode RE1 and extend from the optical bezel area OBA to the optical area OA.

In one or more embodiments, in FIG. 8, the anode extension line AEL may be a metal layer disposed on the first relay electrode RE1 and include a transparent material.

Referring to FIG. 8, a second planarization layer PLN2 may be disposed on the first relay electrode RE1, the second relay electrode RE2, and the anode extension line AEL such that it covers them.

Referring to FIG. 8, the light emitting element forming part may be located on the second planarization layer PLN2.

Referring to FIG. 8, the light emitting element forming part may include the first light emitting element ED1, the second light emitting element ED2, and the fourth light emitting element ED4, which are disposed on the second planarization layer PLN2.

Referring to FIG. 8, the first light emitting element ED1 and the fourth light emitting element ED4 may be disposed in the optical area OA, and the second light emitting element ED2 may be disposed in the optical bezel area OBA.

In the example of FIG. 8, the first light emitting element ED1, the second light emitting element ED2, and the fourth light emitting element ED4 may be light emitting elements emitting light of a same color. Respective emission layers EL of the first light emitting element ED1, the second light emitting element ED2, and the fourth light emitting element ED4 may be formed independently of one another. However, in discussions that follow, for convenience of explanation, it is assumed that respective emission layers EL of the first light emitting element ED1, the second light emitting element ED2, and the fourth light emitting element ED4 are commonly formed as one common emission layer.

Referring to FIG. 8, the first light emitting element ED1 may be configured (e.g., made up) in an area where the first anode electrode AE1, the emission layer EL, and the cathode electrode CE overlap one another. The second light emitting element ED2 may be configured (e.g., made up) in an area where the second anode electrode AE2, the emission layer EL, and the cathode electrode CE overlap one another. The fourth light emitting element ED4 may be configured (e.g., made up) in an area where the fourth anode electrode AE4, the emission layer EL, and the cathode electrode CE overlap one another.

Referring to FIG. 8, the first anode electrode AE1, the second anode electrode AE2, and the fourth anode electrode AE4 may be disposed on the second planarization layer PLN2.

The second anode electrode AE2 may be connected to the second relay electrode RE2 through a hole formed in the second planarization layer PLN2.

The first anode electrode AE1 may be connected to an anode extension line AEL extending from the optical bezel area OBA to the optical area OA through another hole formed in the second planarization layer PLN2.

The fourth anode electrode AE4 may be connected to another anode extension line AEL extending from the optical bezel area OBA to the optical area OA through further another hole formed in the second planarization layer PLN2.

Referring to FIG. 8, a bank BK may be disposed on the first anode electrode AE1, the second anode electrode AE2, and the fourth anode electrode AE4.

The bank BK may include a plurality of bank holes, and respective portions of the first anode electrode AE1, the second anode electrode AE2, and the fourth anode electrode AE4 may be exposed through respective bank holes. That is, the plurality of bank holes formed in the bank BK may respectively overlap the respective portions of the first anode electrode AE1, the second anode electrode AE2, and the fourth anode electrode AE4.

Referring to FIG. 8, the emission layer EL may be disposed on the bank BK. The emission layer EL may contact the respective portions of the first anode electrode AE1, the second anode electrode AE2, and the fourth anode electrode AE4 through the plurality of bank holes.

Referring to FIG. 8, at least one spacer SPCR may be present between the emission layer EL and the bank BK.

Referring to FIG. 8, the cathode electrode CE may be disposed on the emission layer EL. The cathode electrode CE may include a plurality of cathode holes CH. The plurality of cathode holes CH formed in the cathode electrode CE may be disposed in the optical area OA.

One cathode hole CH illustrated in FIG. 8 may represent a cathode hole located between the first light emitting area EA1 and the fourth light emitting area EA4.

Referring to FIG. 8, the encapsulation part may be located on the cathode electrode CE. The encapsulation part may include an encapsulation layer ENCAP disposed on the cathode electrode CE.

Referring to FIG. 8, the encapsulation layer ENCAP can serve to prevent penetration of moisture or oxygen into the light emitting elements (ED1, ED2, and ED4) disposed under the encapsulation layer ENCAP. In particular, the encapsulation layer ENCAP may include an organic material or film and can serve to prevent penetration of moisture or oxygen into the emission layer EL. In one or more embodiments, the encapsulation layer ENCAP may include a stack of a single layer or a stack of a multilayer.

Referring to FIG. 8, the encapsulation layer ENCAP may include a first encapsulation layer PAS1, a second encapsulation layer PCL, and a third encapsulation layer PAS2. First encapsulation layer PAS1 and the third encapsulation layer PAS2 may be, for example, inorganic material layers, and the second encapsulation layer PCL may be, for example, an organic material layer.

Since the second encapsulation layer PCL is implemented using an organic material, the second encapsulation layer PCL may serve as a planarization layer.

In one or more embodiments, a touch sensor may be embedded into the display panel 110 according to aspects of the present disclosure. In these embodiments, the display panel 110 according to aspects of the present disclosure may include a touch sensor part disposed on the encapsulation layer ENCAP.

Referring to FIG. 8, the touch sensor part may include touch sensor metals TSM and bridge metals BRG, and may further include one or more insulating layers such as a sensor buffer layer S-BUF, a sensor interlayer insulating layer S-ILD, a sensor protective layer S-PAC, and the like.

The sensor buffer layer S-BUF may be disposed on the encapsulation layer ENCAP. The bridge metals BRG may be disposed on the sensor buffer layer S-BUF, and the sensor interlayer insulating layer S-ILD may be disposed on the bridge metals BRG.

The touch sensor metals TSM may be disposed on the sensor interlayer insulating layer S-ILD. One or more of the touch sensor metals TSM may be connected to one or more respective bridge metals BRG of the bridge metals BRG through one or more respective holes formed in the sensor interlayer insulating layer S-ILD.

Referring to FIG. 8, the touch sensor metals TSM and the bridge metals BRG may be disposed in the optical bezel area OBA. The touch sensor metals TSM and the bridge metals BRG may be disposed not to overlap the second light emitting area EA2 of the optical bezel area OBA.

A plurality of touch sensor metals TSM may be configured as one touch electrode (or one touch electrode line). For example, the plurality of touch sensor metals TSM may be arranged in a mesh pattern and therefore electrically connected to one another. One or more of the touch sensor metals TSM and the remaining one or more touch sensor metals TSM may be electrically connected through one or more respective bridge metals BRG, and thereby, be configured as one touch electrode (or one touch electrode line).

The sensor protective layer S-PAC may be disposed such that it covers the touch sensor metals TSM and the bridge metals BRG.

In an embodiment where a touch sensor is embedded into the display panel 110, at least one of the touch sensor metals TSM, or at least a portion of at least one of the touch sensor metals TSM, located on the encapsulation layer ENCAP may extend along an inclined surface formed in an edge of the encapsulation layer ENCAP, and be electrically connected to a pad located in an edge of the display panel 110 that is further away from the inclined surface of the edge of the encapsulation layer ENCAP. The pad may be disposed in the non-display area NDA and may be a metal pattern to which the touch driving circuit 260 is electrically connected.

The display panel 110 according to aspects of the present disclosure may include the bank BK disposed on the first anode electrode AE1 and having a bank hole exposing a portion of the first anode electrode AE1, and the emission layer EL disposed on the bank BK and contacting the portion of the first anode electrode AE1 exposed through the bank hole.

The bank hole formed in the bank BK may not overlap a plurality of cathode holes CH. For example, the bank BK may not be depressed or perforated at a place where any one of the plurality of cathode holes CH is present. Thus, at a place where any one of the plurality of cathode holes CH is present, the second planarization layer PLN2 and the first planarization layer PLN1 located under the bank BK may not be depressed or perforated as well.

The flat state of the respective portion of the upper surface of the bank BK located under any one of the plurality of cathode holes CH may mean that one or more insulating layers or one or more metal patterns (e.g., one or more electrode, one or more lines, and/or the like), or the emission layers EL located under any one of the plurality of cathode holes CH have not been damaged by the process of forming the plurality of cathode holes CH in the cathode electrode CE.

A brief description for the process of forming cathode holes CH in the cathode electrode CE is as follows. A specific mask pattern may be deposited at respective locations where the cathode holes CH are to be formed, and then, a cathode electrode material may be deposited thereon. Accordingly, the cathode electrode material may be deposited only in an area where the specific mask pattern is not located, and thereby, the cathode electrode CE including the cathode holes CH can be formed. The specific mask pattern may include, for example, an organic material. The cathode electrode material may include a magnesium-silver (Mg—Ag) alloy.

In one or more embodiments, after the cathode electrode CE having the cathode holes CH is formed, the display panel 110 may be in a situation in which the specific mask pattern is completely removed, partially removed (where a portion of the specific mask pattern remains), or not removed (where all of the specific mask pattern remains without being removed).

The display panel 110 according to aspects of the present disclosure may include the first driving transistor DT1 disposed in the optical bezel area OBA to drive the first light emitting element ED1 disposed in the optical area OA, and the second driving transistor DT2 disposed in the optical bezel area OBA to drive the second light emitting element ED2 disposed in the optical bezel area OBA.

The display panel 110 according to aspects of the present disclosure may further include the first planarization layer PLN1 disposed on the first driving transistor DT1 and the second driving transistor DT2, the first relay electrode RE1 disposed on the first planarization layer PLN1 and electrically connected to the first source electrode S1 of the first driving transistor DT1 through a hole formed in the first planarization layer PLN1, the second relay electrode RE2 disposed on the first planarization layer PLN1 and electrically connected to the second source electrode S2 of the second driving transistor DT2 through another hole formed in the first planarization layer PLN1, and the second planarization layer PLN2 disposed on the first relay electrode RE1 and the second relay electrode RE2.

The display panel 110 according to aspects of the present disclosure may further include an anode extension line (e.g., the anode extension line AEL) connecting the first relay electrode RE1 to the first anode electrode AE1, and located on the first planarization layer PLN1.

The second anode electrode AE2 may be electrically connected to the second relay electrode RE2 through a hole formed in the second planarization layer PLN2, and the first anode electrode AE1 may be electrically connected to the anode extension line AEL through another hole formed in the second planarization layer PLN2.

All or a portion of the anode extension line AEL may be disposed in the optical area OA, and the anode extension line AEL may include a transparent material, or be or include a transparent line.

The first pixel circuit SPC1 may include the first driving transistor DT1 for driving the first light emitting element ED1, and the second pixel circuit SPC2 may include the second driving transistor DT2 for driving the second light emitting element ED2.

The first active layer ACT1 of the first driving transistor DT1 may be located in a different layer from the second active layer ACT2 of the second driving transistor DT2.

The display panel 110 according to aspects of the present disclosure may further include the substrate SUB, the first buffer layer BUF1 disposed between the substrate SUB and the first driving transistor DT1, and the second buffer layer BUF2 disposed between the first driving transistor DT1 and the second driving transistors DT2.

The first active layer ACT1 of the first driving transistor DT1 may include a different semiconductor material from the second active layer ACT2 of the second driving transistor DT2.

For example, the second active layer ACT2 of the second driving transistor DT2 may include an oxide semiconductor material. For example, such an oxide semiconductor material may include indium gallium zinc oxide (IGZO), indium gallium zinc tin oxide (IGZTO), zinc oxide (ZnO), cadmium oxide (CdO), indium oxide (InO), zinc tin oxide (ZTO), zinc indium tin oxide (ZITO), and/or the like.

For example, the first active layer ACT1 of the first driving transistor DT1 may include a different semiconductor material from the second active layer ACT2 of the second driving transistor DT2.

For example, the first active layer ACT1 of the first driving transistor DT1 may include a silicon-based semiconductor material. For example, the silicon-based semiconductor material may include low-temperature polycrystalline silicon (LTPS) or the like.

The display panel 110 according to aspects of the present disclosure may further include the encapsulation layer ENCAP located on the first light emitting element ED1, the second light emitting element ED2, and the third light emitting element ED3, and touch sensor metals TSM located on the encapsulation layer ENCAP.

The touch sensor metals TSM may be disposed in the normal area NA and the optical bezel area OBA. The touch sensor metals TSM may not be disposed in the optical area OA, or the touch sensor metals TSM may be disposed in the optical area OA, the normal area NA and the optical bezel area OBA such that the optical area OA has a lower touch sensor metal density than each of the normal area NA and the optical bezel area OBA.

Referring to FIG. 8, the optical area OA may overlap an optical electronic device. The optical bezel area OBA may not overlap an optical electronic device. In one or more embodiments, a portion of the optical bezel area OBA may overlap an optical electronic device.

The optical electronic device overlapping the optical area OA may be the first optical electronic device 11 and/or the second optical electronic device 12 discussed above. For example, the optical electronic device may include a camera, an infrared sensor, an ultraviolet sensor, and/or the like. For example, the optical electronic device may be a device capable of receiving visible light and performing a predetermined operation, or a device capable of receiving light (e.g., infrared light, and/or ultraviolet light) different from visible light and performing a predetermined operation.

Referring to FIG. 8, a cross-sectional structure of the normal area NA may be substantially or nearly the same as that of the optical bezel area OBA. It should be noted here that the first pixel circuit SPC1 disposed in the optical bezel area OBA to drive the first light emitting element ED1 disposed in the optical area OA may not be disposed in the normal area NA.

Figure 9:
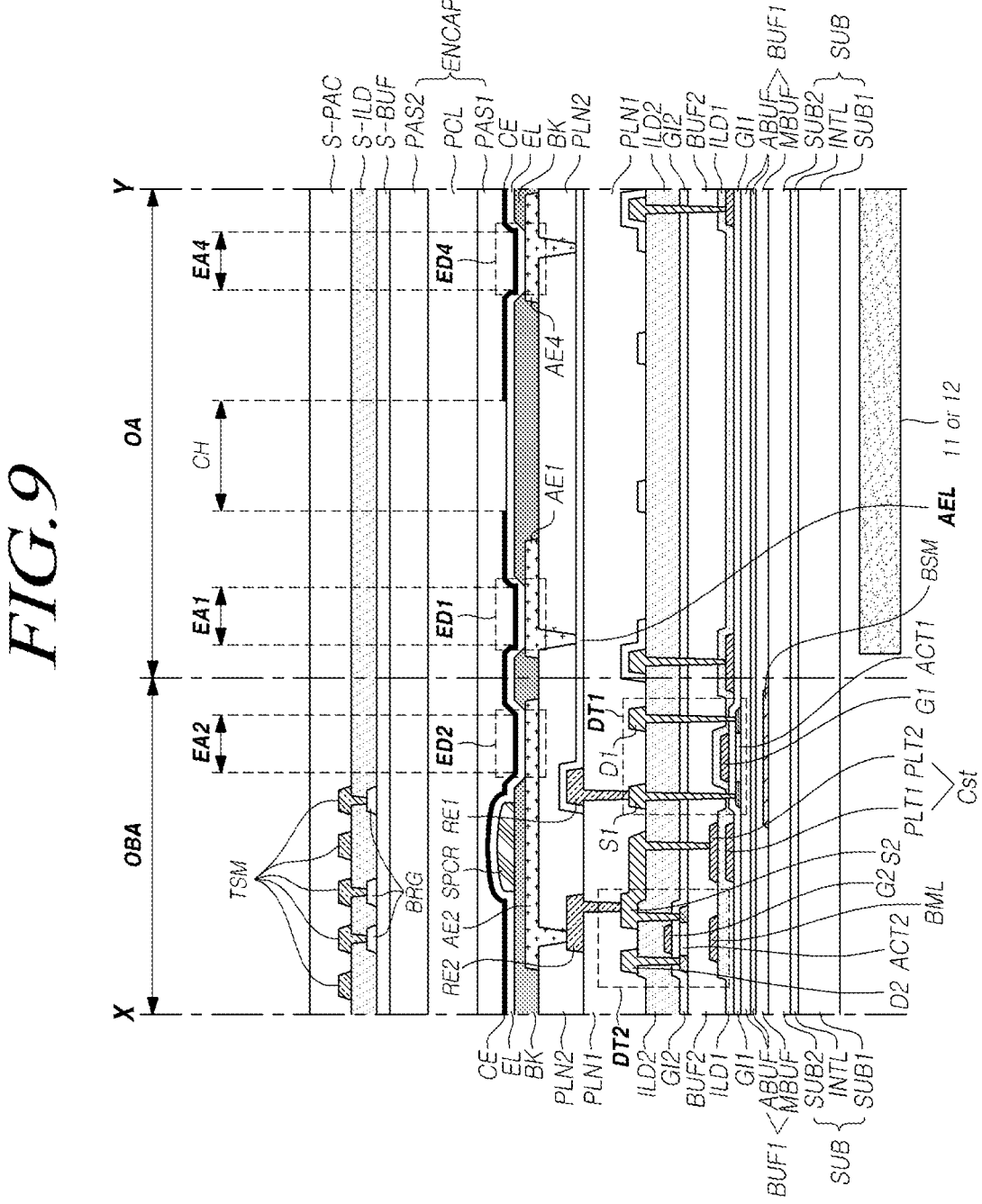

FIG. 9 illustrates an example cross-sectional view of the display panel 110 according to aspects of the present disclosure, and more specifically, illustrates example cross-sectional views in the optical bezel area OBA and the optical area OA of the display panel 110. It should be noted here that FIG. 9 illustrates the cross-sectional view based on the application of a 1:2 circuit connection scheme, as in FIG. 6.

The sectional view of FIG. 9 is basically the same as the sectional view of FIG. 8. It should be noted here that one difference between the cross-sectional views of FIGS. 8 and 9 is that while FIG. 8 employs the 1:1 circuit connection scheme as in FIG. 5, FIG. 9 employs the 1:2 circuit connection scheme as in FIG. 6. Taking account of the similarity between them, hereinafter, descriptions on the sectional structure of FIG. 9 will be provided by focusing on features different from the sectional structure of FIG. 8.

Referring to FIG. 9, the first light emitting element ED1 and the fourth light emitting element ED4 disposed in the optical area OA may be driven by the first driving transistor DT1 disposed in the optical bezel area OBA together or substantially simultaneously.

Accordingly, as illustrated in FIG. 9, an anode extension line AEL may be further electrically connected to the fourth anode electrode AE4 different from the first anode electrode AE1, as well as the first anode electrode AE1. Thus, the anode extension line AEL may be electrically connected to both the first anode electrode AE1 of the first light emitting element ED1 and the fourth anode electrode AE4 of the fourth light emitting element ED4.

Referring to FIG. 9, the anode extension line AEL may overlap a cathode hole CH located between the first light emitting element ED1 and the fourth light emitting element ED4 among a plurality of cathode holes CH.

Referring to FIG. 9, the first light emitting area EA1 configured by the first light emitting element ED1 and the fourth light emitting area EA4 configured by the fourth light emitting element ED4 may be light emitting areas emitting light of a same color.

Figure 10:
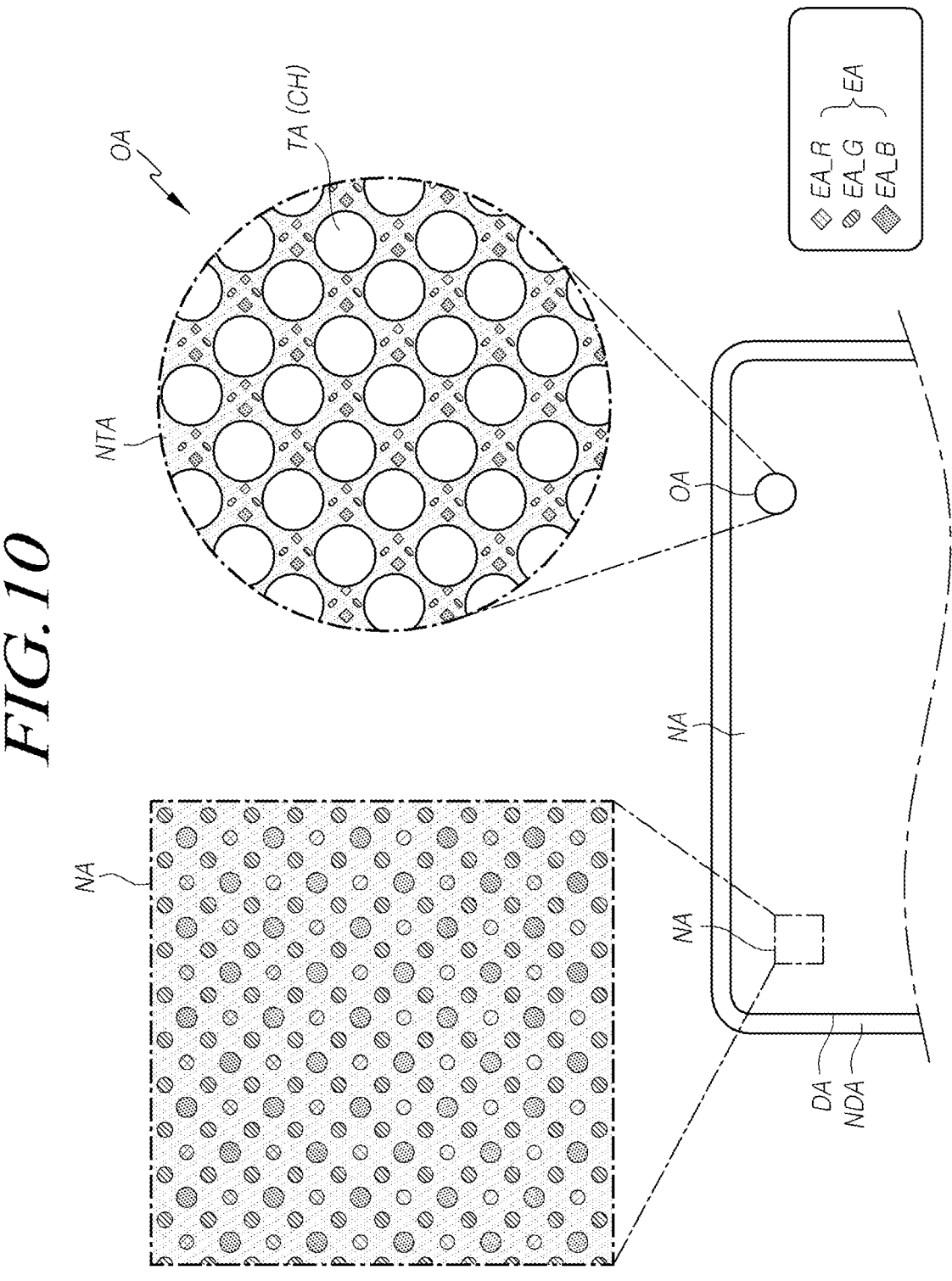
FIG. 10 schematically illustrates an example second type optical area and an example normal area around the second type optical area in the display panel according to aspects of the present disclosure.

FIG. 10 schematically illustrates an example second type optical area OA and an example normal area NA around the second type optical area OA in the display panel 110 according to aspects of the present disclosure.

Referring to FIG. 10, the display area DA may include the optical area OA (e.g., the second type optical area OA). In an example where the optical area OA is configured with the second type, the optical area OA may include a plurality of transmission areas TA and a non-transmission area NTA. Herein, the second type is also referred to as a hole type.

In the optical area OA, the non-transmission area NTA may represent an area except for the plurality of transmission areas TA.

Referring to FIG. 10, the non-transmission area NTA in the optical area OA may include a plurality of light emitting areas EA. A plurality of light emitting elements ED for the plurality of light emitting areas EA may be disposed in the non-transmission area NTA in the optical area OA.

Further, a plurality of pixel circuits SPC for driving the plurality of light emitting elements ED may be disposed in the non-transmission area NTA in the optical area OA. Thus, the plurality of pixel circuits SPC may be disposed in the non-transmission area NTA in the optical area OA. In contrast, in the case of the first type, the plurality of pixel circuits SPC are not disposed in the optical area OA.

In the case of the second type, the transistors (DT, ST) and the storage capacitors Cst may be disposed in the optical area OA. In the case of the first type, the transistors (DT, ST) and the storage capacitors Cst may not be disposed in the optical area OA.

Referring to FIG. 10, the arrangement of light emitting areas EA in the optical area OA may be the same as the arrangement of light emitting areas EA in the normal area NA.

In one or more embodiments, referring to FIG. 10, a respective area of each of the plurality of light emitting areas EA included in the optical area OA may be the same or substantially or nearly the same as, or be different within a predetermined range from, a respective area of each of a plurality of light emitting areas EA included in the normal area NA.

A cathode electrode (e.g., the cathode electrode CE in FIG. 3) may be commonly disposed in the normal area NA and the optical area OA, and may include a plurality of cathode holes CH in the optical area OA. The plurality of cathode holes CH of the cathode electrode CE may respectively correspond to the transmission areas TA of the optical area OA.

Since the optical area OA includes the plurality of transmission areas TA, the optical area OA may have higher transmittance than the normal area NA.

All or a portion of the optical area OA may overlap an optical electronic device.

The optical electronic device overlapping the optical area OA may be the first optical electronic device 11 and/or the second optical electronic device 12 discussed above. For example, the optical electronic device may include a camera, an infrared sensor, an ultraviolet sensor, and/or the like. For example, the optical electronic device may be a device capable of receiving visible light and performing a predetermined operation, or a device capable of receiving light (e.g., infrared light, and/or ultraviolet light) different from visible light and performing a predetermined operation.

Figure 11:
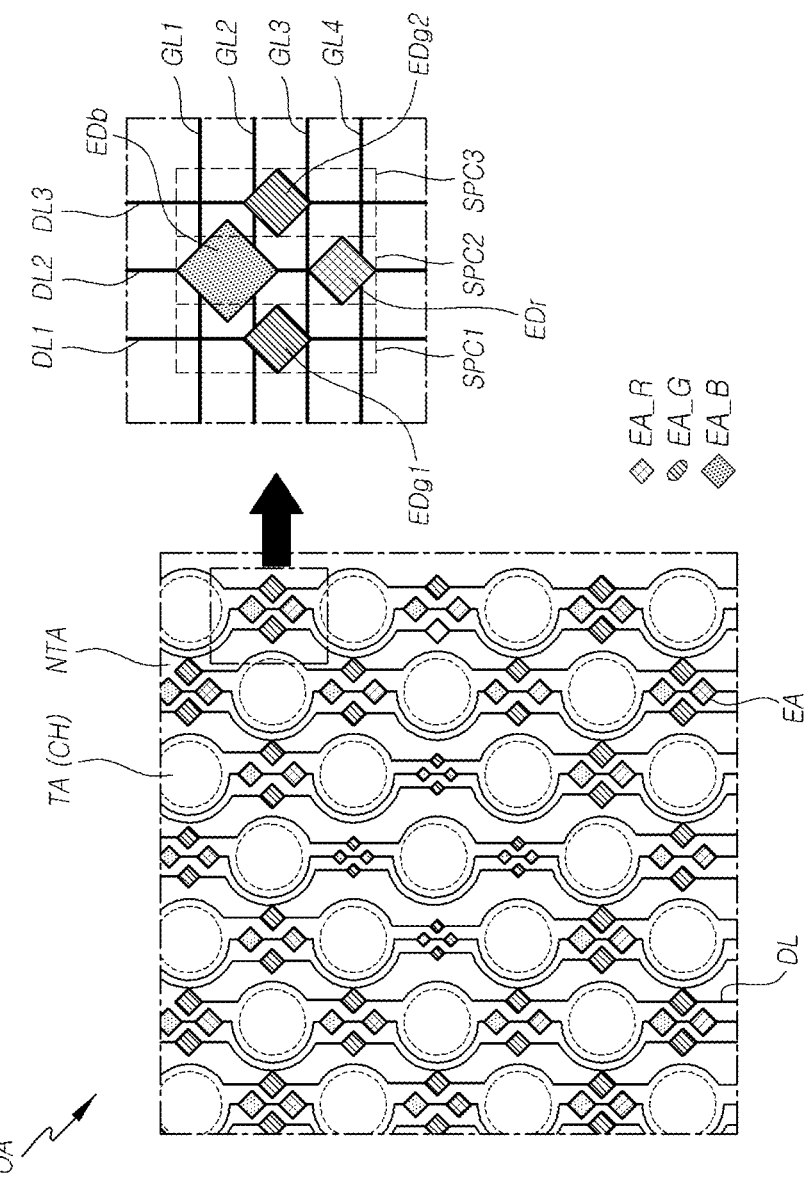
FIG. 11 is an example plan view of the second type optical area in the display panel according to aspects of the present disclosure.

FIG. 11 is an example plan view of the second type optical area OA (e.g., as in the configuration of the FIG. 10) in the display panel 110 according to aspects of the present disclosure.

Referring to FIG. 11, when the optical area OA is configured with the second type, the optical area OA may include a non-transmission area (e.g., the non-transmission area NTA of FIG. 10) and one or more transmission areas TA except for the non-transmission area NTA.

The non-transmission area NTA may include a plurality of light emitting areas EA.

A respective light emitting element ED may be disposed in each of the plurality of light emitting areas EA.

A plurality of pixel circuits SPC for driving the plurality of light emitting elements ED may be disposed in the non-transmission area NTA.

In the second type optical area OA, the light emitting elements ED and the pixel circuits SPC may partially overlap each other.

In the case of the second type optical area OA, data lines (DL1, DL2 and DL3) and gate lines (GL1, GL2, GL3, and GL4) can run across the optical area OA.

In the optical area OA, the data lines (DL1, DL2 and DL3) may be arranged in a row direction (or a column direction) while avoiding one or more transmission areas TA, which correspond to one or more respective cathode holes CH.

In the optical area OA, the gate lines (GL1, GL2, GL3, and GL4) may be arranged in the column direction (or the row direction) while avoiding one or more transmission areas TA, which correspond to one or more respective cathode holes CH.

The data lines (DL1, DL2 and DL3) and the gate lines (GL1, GL2, GL3, and GL4) may be connected to pixel circuits (SPC1, SPC2, and SPC3) disposed in the optical area OA.

For example, four light emitting elements (EDr, EDg1, EDg2, and EDb) may be disposed in a portion of the non-transmission area NTA between four adjacent transmission areas TA. The four light emitting elements (EDr, EDg1, EDg2, and EDb) may include one red light emitting element EDr, two green light emitting elements EDg1 and EDg2, and one blue light emitting element EDb.

For example, a pixel circuit SPC1 for driving the one red light emitting element EDr may be connected to a first data line DL1 and a first gate line GL1. A pixel circuit SPC2 for driving the two green light emitting elements EDg1 and EDg2 may be connected to a second data line DL2, a second gate line GL2, and a third gate line GL3. A pixel circuit SPC3 for driving the one blue light emitting element EDb may be connected to a third data line DL3 and a fourth gate line GL4.

Figure 12:
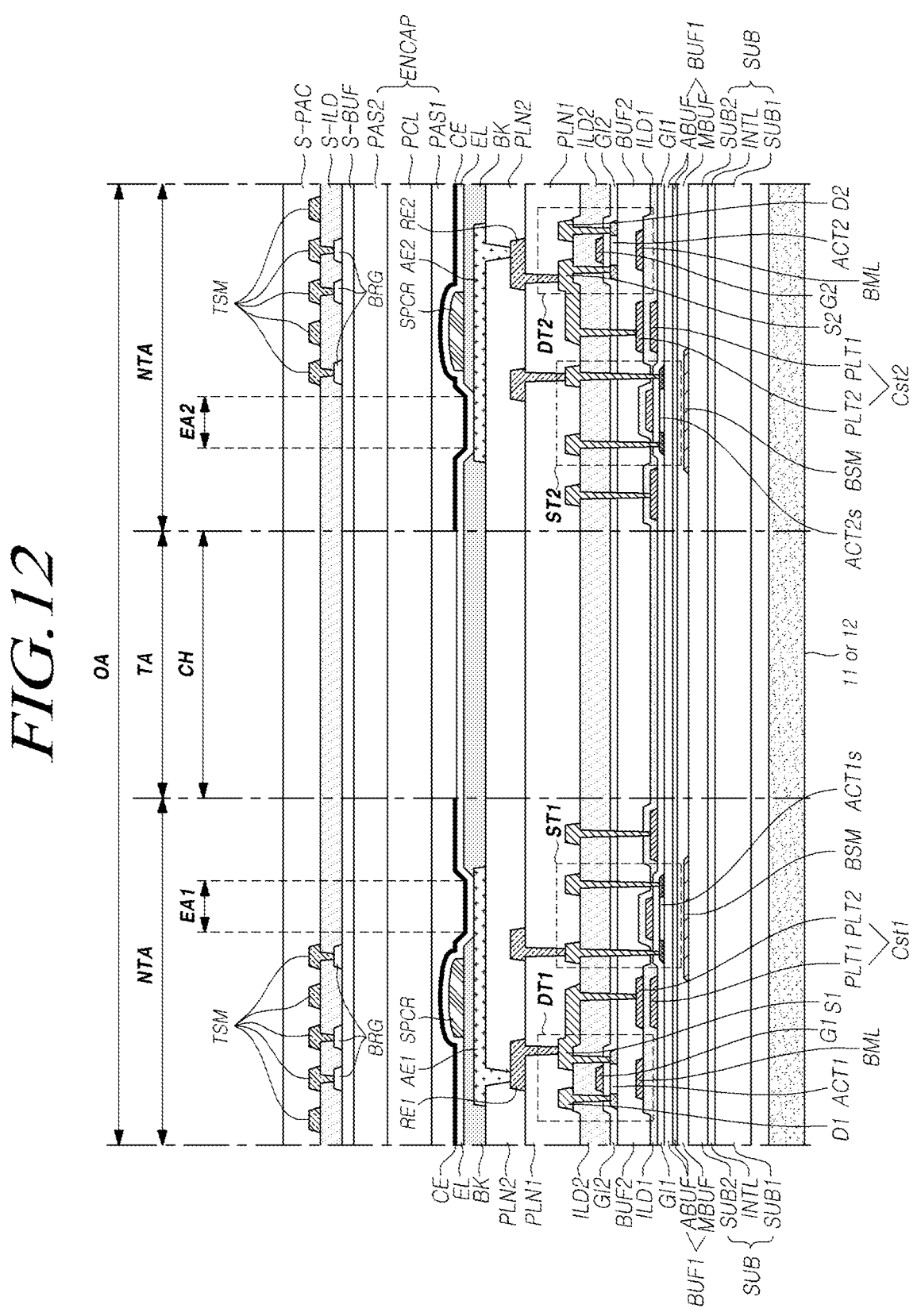
FIG. 12 is an example cross-sectional view of the second type optical area in the display panel according to aspects of the present disclosure.

FIG. 12 is an example cross-sectional view of the second type optical area OA (e.g., as in the configuration of FIGS. 10 and 11) in the display panel 110 according to aspects of the present disclosure.

Metal layers and insulating layers in the cross-sectional structure of FIG. 12 may be the same, or substantially or nearly the same, as the metal layers and insulating layers in the cross-sectional structures of FIGS. 8 and 9. Taking account of the similarity between them, discussions on the cross-sectional structure of FIG. 12 will be provided by focusing on features different from those of the cross-sectional structures of FIGS. 8 and 9.

Referring to FIG. 12, an optical electronic device may be disposed such that it overlaps all or a portion of the optical area OA. The optical electronic device may be the first optical electronic device 11 and/or the second optical electronic device 12 discussed above.

Referring to FIG. 12, a first light emitting element ED1 and a second light emitting element ED2 may be disposed in the optical area OA. A first light emitting area EA1 configured by the first light emitting element ED1 and a second light emitting area EA2 configured by the second light emitting element ED2 may be light emitting areas emitting light of a same color.

Referring to FIG. 12, an area where the first light emitting element ED1 and the second light emitting element ED2 are disposed may be the non-transmission area NTA, and a transmission area TA may be present between the first light emitting element ED1 and the second light emitting element ED2. That is, the transmission area TA may present between the first light emitting area EA1 configured by the first light emitting element ED1 and the second light emitting area EA2 configured by the second light emitting element ED2.

A pixel circuit SPC may be configured to drive the first light emitting element ED1, and be disposed to overlap all or a portion of the first light emitting element ED1 in the optical area OA.

Referring to FIG. 12, the pixel circuit SPC for driving the first light emitting element ED1 may include a first driving transistor DT1, a first scan transistor ST1, and a first storage capacitor Cst1.

A pixel circuit SPC may be configured to drive the second light emitting element ED2, and be disposed to overlap all or a portion of the second light emitting element ED2 in the optical area OA.

Referring to FIG. 12, the pixel circuit SPC for driving the second light emitting element ED2 may include a second driving transistor DT2, a second scan transistor ST2, and a second storage capacitor Cst2.

Referring to FIG. 12, the first driving transistor DT1 may include a first active layer ACT1, a first gate electrode G1, a first source electrode S1, and a first drain electrode D1.

The first light emitting element ED1 may be configured (e.g., made up) in an area where a first anode electrode AE1, an emission layer (e.g., the emission layer EL discussed above), and a cathode electrode (e.g., the cathode electrode CE discussed above) overlap one another.

The first source electrode S1 of the first driving transistor DT1 may be connected to the first anode electrode AE1 through a first relay electrode RE1.

The first storage capacitor Cst1 may include a first capacitor electrode PLT1 and a second capacitor electrode PLT2.

The first source electrode S1 of the first driving transistor DT1 may be connected to the second capacitor electrode PLT2 of the first storage capacitor Cst1.

The first gate electrode G1 of the first driving transistor DT1 may be connected to the first capacitor electrode PLT1 of the first storage capacitor Cst1.

The active layer ACT1s of the first scan transistor ST1 may be located on the first buffer layer BUF1 and be located in a lower location than the first active layer ACT1 of the first driving transistor DT1.

A semiconductor material included in the active layer ACT1s of the first scan transistor ST1 may be different from a semiconductor material included in the first active layer ACT1 of the first driving transistor DT1. For example, the semiconductor material included in the first active layer ACT1 of the first driving transistor DT1 may be an oxide semiconductor material, and the semiconductor material included in the active layer ACT1s of the first scan transistor ST1 may be a silicon-based semiconductor material (e.g., a low-temperature polycrystalline silicon (LTPS)).

Referring to FIG. 12, the second driving transistor DT2 may include a second active layer ACT2, a second gate electrode G2, a second source electrode S2, and a second drain electrode D2.

The second light emitting element ED2 may be configured (e.g., made up) in an area where a second anode electrode AE2, the emission layer EL, and the cathode electrode CE overlap one another.

The second source electrode S2 of the second driving transistor DT2 may be connected to the second anode electrode AE2 through a second relay electrode RE2.

The second storage capacitor Cst2 may include a first capacitor electrode PLT1 and a second capacitor electrode PLT2.

The second source electrode S2 of the second driving transistor DT2 may be connected to the second capacitor electrode PLT2 of the second storage capacitor Cst2.

The second gate electrode G2 of the second driving transistor DT2 may be connected to the first capacitor electrode PLT1 of the second storage capacitor Cst2.

An active layer ACT2s of the second scan transistor ST2 may be located on the first buffer layer BUF1 and be located in a lower location than the second active layer ACT2 of the second driving transistor DT2.

A semiconductor material included in the active layer ACT2s of the second scan transistor ST2 may be different from a semiconductor material included in the second active layer ACT2 of the second driving transistor DT2. For example, the semiconductor material included in the second active layer ACT2 of the second driving transistor DT2 may be an oxide semiconductor material, and the semiconductor material included in the active layer ACT2s of the second scan transistor ST2 may be a silicon-based semiconductor material (e.g., a low-temperature polycrystalline silicon (LTPS)).

The cathode electrode CE may not include a cathode hole CH or may include a plurality of cathode holes CH.

In an example where the cathode electrode CE includes a plurality of cathode holes CH, the cathode holes CH formed in the cathode electrode CE may be located to correspond to respective transmission areas TA of the optical area OA.

A bank hole formed in the bank BK may not overlap any one of the cathode holes CH.

An upper surface of the bank BK located in a lower location than the cathode holes CH may be flat without being depressed or etched. For example, the bank BK may not be depressed or perforated at places where cathode holes CH are present. Thus, at places where cathode holes CH are present, the second planarization layer PLN2 and the first planarization layer PLN1 located in a lower location than the bank BK may not be depressed or perforated as well.

The flat state of the respective portions of the upper surface of the bank BK located under the cathode holes CH may mean that one or more insulating layers or one or more metal patterns (e.g., one or more electrode, one or more lines, and/or the like), or the emission layer EL located under the cathode electrode CE have not been damaged by the process of forming the cathode holes CH in the cathode electrode CE.

A brief description for the process of forming cathode holes CH in the cathode electrode CE is as follows. A specific mask pattern may be deposited at respective locations where the cathode holes CH are to be formed, and then, a cathode electrode material may be deposited thereon. Accordingly, the cathode electrode material may be deposited only in an area where the specific mask pattern is not located, and thereby, the cathode electrode CE including the cathode holes CH can be formed.

The specific mask pattern may include, for example, an organic material. The cathode electrode material may include a magnesium-silver (Mg—Ag) alloy.

In one or more embodiments, after the cathode electrode CE having the cathode holes CH is formed, the display panel 110 may be in a situation in which the specific mask pattern is completely removed, partially removed (where a portion of the specific mask pattern remains), or not removed (where all of the specific mask pattern remains without being removed).

Figure 13:
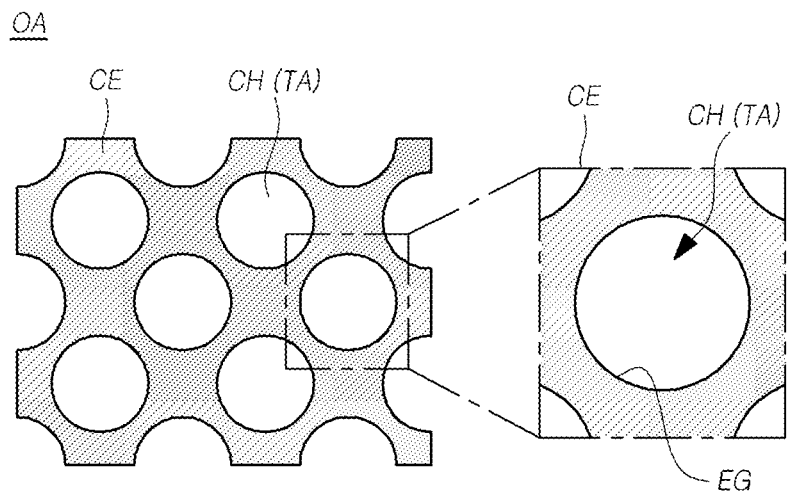
FIG. 13 illustrates an example cathode electrode in the optical area of the display panel according to aspects of the present disclosure.

FIG. 13 illustrates an example portion of the cathode electrode CE in the optical area OA of the display panel 110 according to aspects of the present disclosure.

Referring to FIG. 13, in order to increase the transmittance of the optical area OA, a plurality of cathode holes CH may be formed in the cathode electrode CE in the optical area OA. For example, the plurality of cathode holes CH formed in the cathode electrode CE may be disposed in the optical area OA.

The cathode holes CH of the cathode electrode CE may have various shapes, such as a circular shape, an elliptical shape, a rectangular shape, an octagonal shape, various polygonal shapes, or irregular shapes.

Accordingly, respective edges EG of the cathode electrode CE corresponding to the cathode holes CH may also have various shapes, such as the circular shape, the elliptical shape, the rectangular shape, the octagonal shape, the various polygonal shapes, or the irregular shapes.

In one or more embodiments, as shown in FIG. 13, the edges EG of the cathode electrode CE may not include a concavo-convex portion. In these embodiments, light passing through small gaps, which are the plurality of cathode holes CH, in the optical area OA may be diffracted. Accordingly, as an optical electronic device located under the optical area OA receives such diffracted light, the accuracy of operation of the optical electronic device using the received light may be reduced. For example, when the optical electronic device is a camera, the camera can receive diffracted light, and thereby, cannot acquire a high-definition image.

That is, due to the structure in which the optical electronic device is located under the display area DA of the display panel 110, the performance of the optical electronic device may be reduced due to a change in characteristics of light reaching the optical electronic device through the display panel 110. For example, in an example where the optical electronic device is a camera, the camera cannot acquire a high-quality image due to a change in characteristics (e.g., the occurrence of diffraction phenomenon) of light reaching the optical electronic device through the display panel 110.

To address this issue, in one or more aspects, the display device 100 and the display panel 110 can be provided that include a diffraction reduction structure capable of reducing the diffraction of light passing through a transmission area TA. Hereinafter, according to one or more embodiments of the present disclosure, a diffraction reduction structure in one or more transmission areas TA will be described with reference to several drawings.

Figure 14:
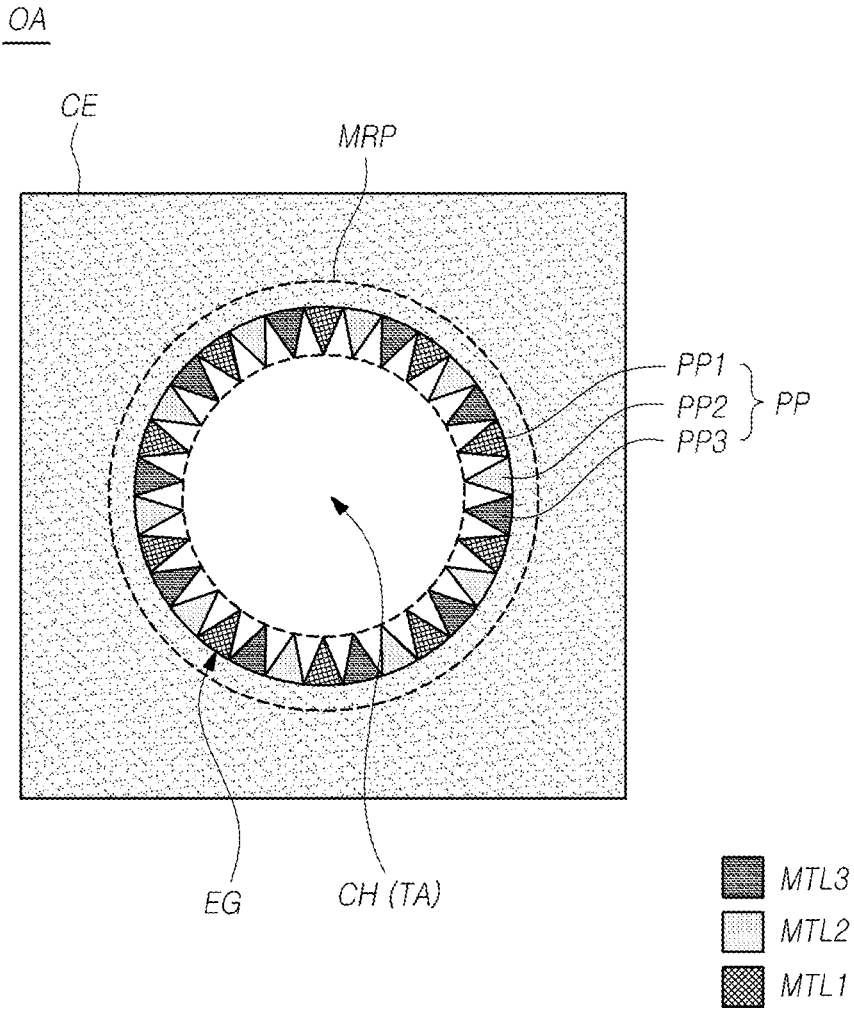
FIG. 14 illustrates an example cathode hole of the cathode electrode and an example ring pattern disposed along an edge of the cathode hole in the optical area of the display panel according to aspects of the present disclosure.

FIG. 14 illustrates an example cathode hole formed in a cathode electrode (e.g., the cathode electrode CE discussed above) and an example ring pattern disposed along an edge of the cathode hole in the optical area OA of the display panel 110 according to aspects of the present disclosure.

Referring to FIG. 14, in one or more embodiments, the display panel 110 may include an optical area (e.g., the optical area OA discussed above) included in the display area DA in which one or more images can be displayed and allowing light to be transmitted, and a normal area (e.g., the normal area NA discussed above) included in the display area DA and located outside of the optical area OA.

Referring to FIG. 14, the cathode electrode CE may be commonly disposed in the optical area OA and the normal area NA (not shown in FIG. 14), and include a plurality of cathode holes CH in the optical area OA.

Referring to FIG. 14, in one or more embodiments, the display panel 110 may include a respective ring pattern MRP corresponding to each of the plurality of cathode holes CH as a diffraction reduction structure. In this manner, one ring pattern MRP may present for each cathode hole CH as one diffraction reduction structure.

For example, referring to FIG. 14, a ring pattern MRP may be disposed to overlap an edge EG of a cathode hole CH.

Referring to FIG. 14, the ring pattern MRP may include a plurality of protrusions PP protruding toward the inside of the cathode hole CH. For example, the plurality of protrusions PP may include a plurality of first protrusions PP1, a plurality of second protrusions PP2, and a plurality of third protrusions PP3.

The plurality of first protrusions PP1, the plurality of second protrusions PP2, and the plurality of third protrusions PP3 may be located in different metal layers.

For example, the plurality of first protrusions PP1 may be configured with, or include, a first metal layer MTL1, the plurality of second protrusions PP2 may be configured with, or include, a second metal layer, and the plurality of third protrusions PP3 may be configured with, or include, a third metal layer MTL3.

In one or more embodiments, the first metal layer MTL1, the second metal layer MTL2, and the third metal layer MTL3 may include different metals from one another, or one of the first metal layer MTL1, the second metal layer MTL2, and the third metal layer MTL3 may include a different metal from the others, or the first metal layer MTL1, the second metal layer MTL2, and the third metal layer MTL3 may include a same metal. In one or more embodiments, the first metal layer MTL1, the second metal layer MTL2, and the third metal layer MTL3 may have different lengths (e.g., heights in the stackup configuration) from the substrate SUB.

Referring to FIG. 14, all or a portion of each of the plurality of protrusions PP in the ring pattern MRP may not overlap the cathode electrode CE.

Referring to FIG. 14, since the plurality of protrusions PP of the ring pattern MRP protrude into the cathode hole CH, the amount of diffraction of light passing through the cathode hole CH, which is a transmission area TA, can be reduced.

Figure 15:
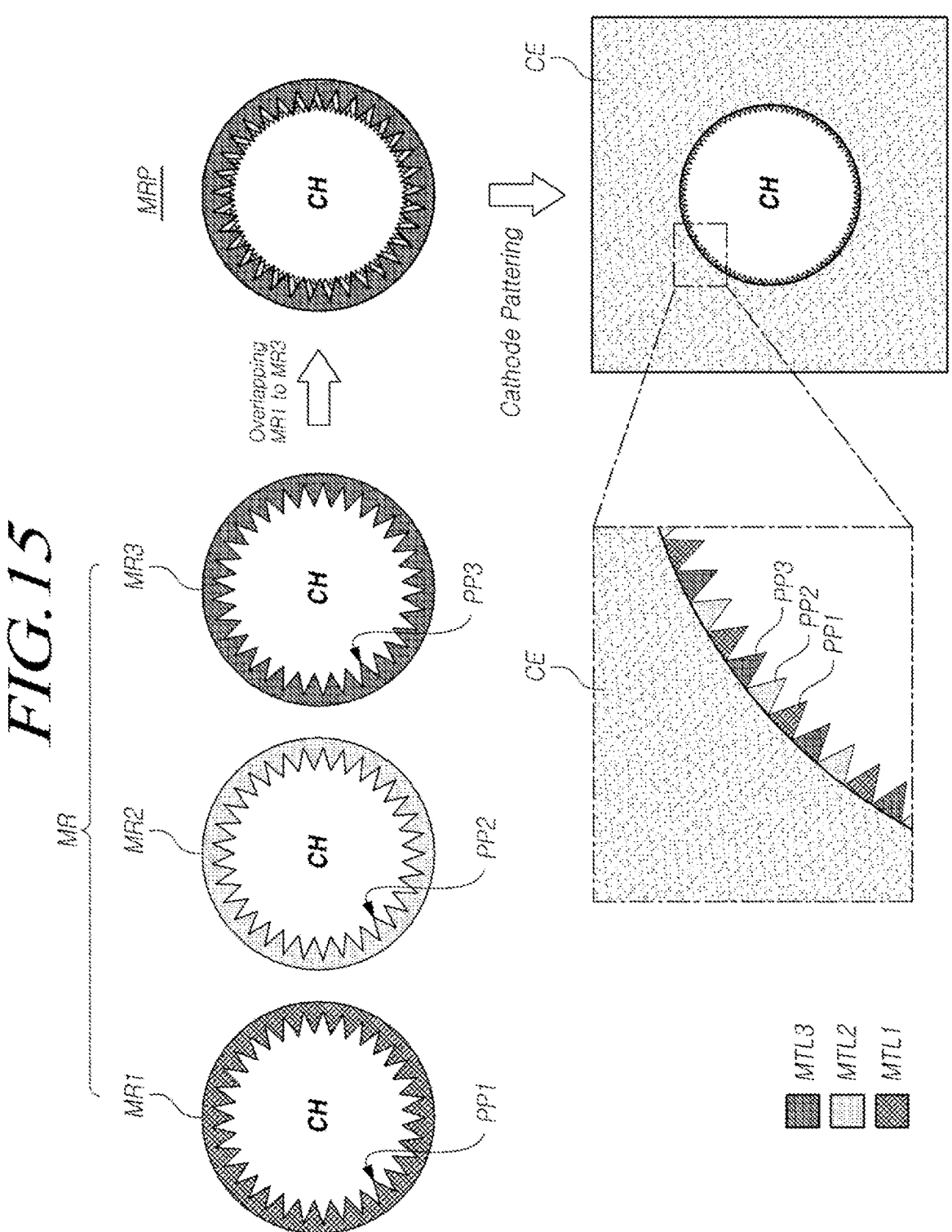
FIG. 15 illustrates an example technique of forming a diffraction reduction structure employed in the display device according to aspects of the present disclosure.

FIG. 15 illustrates an example technique of forming a diffraction reduction structure employed in the display device 100 according to aspects of the present disclosure.

Referring to FIG. 15, a ring pattern MRP may include a plurality of metal rings MR located in different metal layers, and each of the plurality of metal rings MR may include a plurality of protrusions PP protruding toward the inside of a corresponding cathode hole CH among a plurality of cathode holes CH.

Referring to FIG. 15, the plurality of metal rings MR may include a first metal ring MR1 and a second metal ring MR2 different from the first metal ring MR1, and may further include a third metal ring MR3 different from the first and second metal rings MR1 and MR2.

Referring to FIG. 15, the first metal ring MR1 may include a plurality of first protrusions PP1 protruding toward the inside of the cathode hole CH. The second metal ring MR2 may include a plurality of second protrusions PP2 protruding toward the inside of the cathode hole CH. The third metal ring MR3 may include a plurality of third protrusions PP3 protruding toward the inside of the cathode hole CH.

Referring to FIG. 15, the plurality of first protrusions PP1 of the first metal ring MR1 may be arranged along a circular edge EG of the cathode hole CH. The plurality of second protrusions PP2 of the second metal ring MR2 may be arranged along the circular edge EG of the cathode hole CH. The plurality of third protrusions PP3 of the third metal ring MR3 may be arranged along the circular edge EG of the cathode hole CH.

Referring to FIG. 15, each of the plurality of first protrusions PP1 of the first metal ring MR1 may have a pointed end. Each of the plurality of second protrusions PP2 of the second metal ring MR2 may have a pointed end. Referring to FIG. 15, each of the plurality of third protrusions PP3 of the third metal ring MR3 may have a pointed end.

For example, the second metal ring MR2 may be disposed by being rotated by a predetermined angle relative to the first metal ring MR1. In this example, the plurality of second protrusions PP2 of the second metal ring MR2 and the plurality of first protrusions PP1 of the first metal ring MR1 may not completely overlap each other, and thus, all of the plurality of second protrusions PP2 and the plurality of first protrusions PP1 can be visible from the cathode hole CH above.

In other words, as the first metal ring MR1 and the second metal ring MR2 are disposed such that the second metal ring MR2 is rotated by a predetermined angle relative to the first metal ring MR1, one second protrusion PP2 may be therefore located between two adjacent first protrusions PP1.

In one or more embodiments, the third metal ring MR3 may be disposed by being rotated by a predetermined angle relative to the second metal ring MR2. In these embodiments, the plurality of third protrusions PP3 of the third metal ring MR3 and the plurality of second protrusions PP2 of the second metal ring MR2 may not completely overlap each other, and thus, all of the plurality of third protrusions PP3 and the plurality of second protrusions PP2 can be visible from the cathode hole CH above.

In other words, as the second metal ring MR2 and the third metal ring MR3 are disposed such that the third metal ring MR3 is rotated by a predetermined angle relative to the second metal ring MR2, one third protrusion PP3 may be therefore located between two adjacent second protrusions PP2.

In one or more embodiments, one third protrusion PP3 may be located between one first protrusion PP1 and one second protrusion PP2, which are adjacent to each other.

Referring to FIG. 15, each of the plurality of second protrusions PP2 may be located between respective two adjacent first protrusions PP1 among the plurality of first protrusions PP1. Each of the plurality of third protrusions PP3 may be located between respective two adjacent second protrusions PP2 among the plurality of second protrusions PP2. Each of the plurality of third protrusions PP3 may be located between a respective first protrusion PP1 and a respective second protrusion PP2, which are adjacent to each other.

For example, the plurality of first protrusions PP1, the plurality of second protrusions PP2, and the plurality of third protrusions PP3 may be arranged along the circular edge EG of the cathode hole CH such that the first protrusions PP1, the second protrusions PP2, and the third protrusions PP3 are alternately arranged in the sequence of the first protrusion PP1, the second protrusion PP2, and the third protrusion PP3.

Referring to FIG. 15, the metal rings (MR1, MR2, and MR3) may be configured as follows: the first metal ring MR1 may be located in the first metal layer MTL1; the second metal ring MR2 may be located in the second metal layer MTL2 being placed in a higher location than the first metal layer MTL1 from the substrate SUB; and the third metal ring MR3 may be located in the third metal layer MTL3 being placed in a higher location than the second metal layer MTL2 from the substrate SUB.

Referring to FIG. 15, the ring pattern MRP may be completed by overlapping the first metal ring MR1, the second metal ring MR2, and the third metal ring MR3. Thereafter, by forming the cathode electrode CE having the cathode hole CH on the ring pattern MRP through a cathode patterning process, the diffraction reduction structure can be completed.

Figure 16:
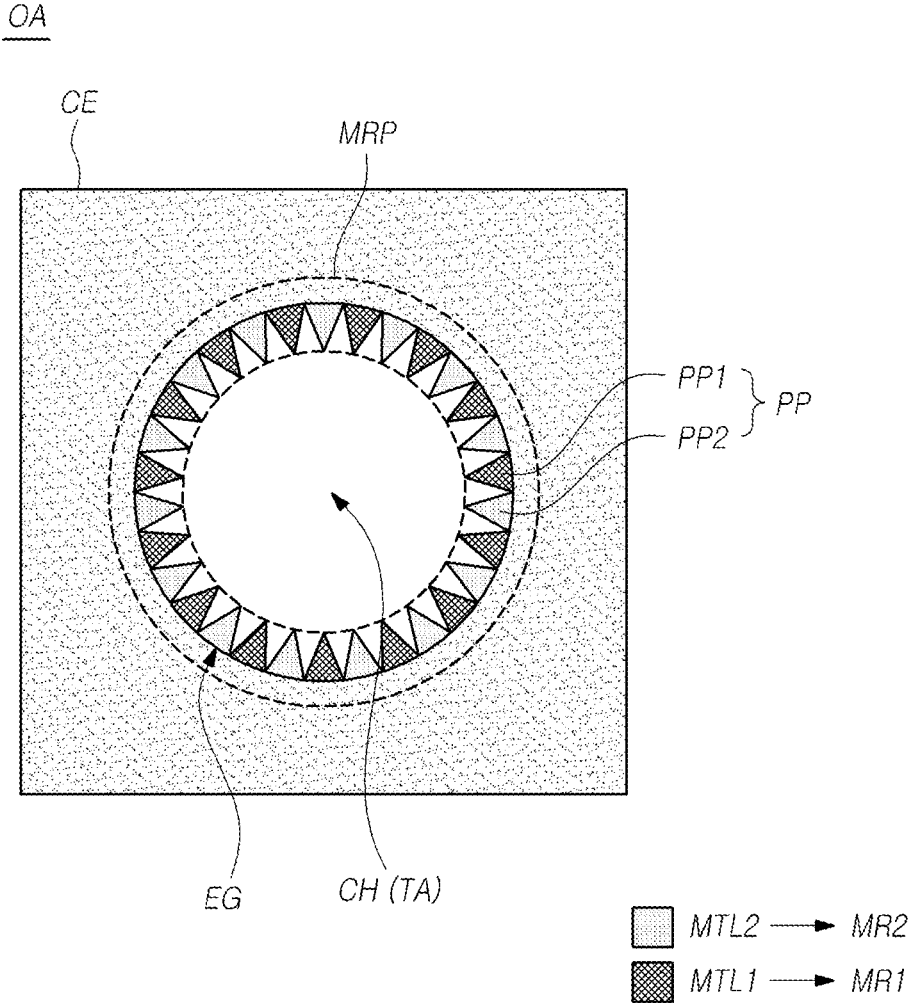
FIG. 16 illustrates an example ring pattern disposed along an edge of a cathode hole and including two metal rings in the optical area of the display panel according to aspects of the present disclosure.

FIG. 16 illustrates an example ring pattern MRP disposed along an edge EG of a cathode hole (e.g., one cathode hole CH among the plurality of the cathode holes CH discussed above) and including two metal rings MR1 and MR2 in the optical area OA of the display panel 110 according to aspects of the present disclosure.

Referring to FIG. 16, a plurality of metal rings MR may include a first metal ring MR1 and a second metal ring MR2.

The first metal ring MR1 may include a plurality of first protrusions PP1 protruding toward the inside of the cathode hole CH.

The second metal ring MR2 may include a plurality of second protrusions PP2 protruding toward the inside of the cathode hole CH.

Each of the plurality of first protrusions PP1 may be located between respective two adjacent second protrusions PP2 among the plurality of second protrusions PP2.

The first metal ring MR1 may be located in a first metal layer MTL1.

The second metal ring MR2 may be located in a second metal layer MTL2 being placed in a higher location than the first metal layer MTL1 from the substrate SUB.

Each of the plurality of first protrusions PP1 of the first metal ring MR1 may have a pointed end. Each of the plurality of second protrusions PP2 of the second metal ring MR2 may have a pointed end.

Figure 17:
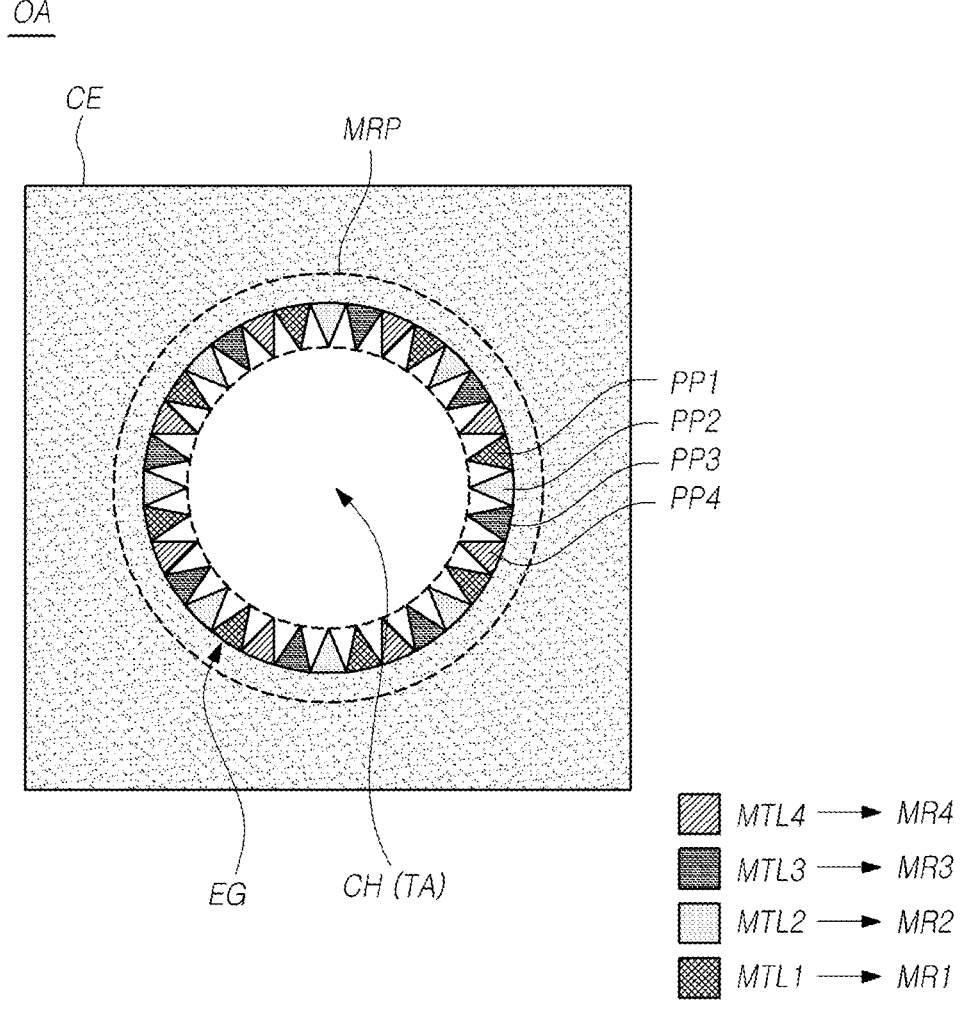
FIG. 17 illustrates an example ring pattern disposed along an edge of a cathode hole and including four metal rings in the optical area of the display panel according to aspects of the present disclosure.

FIG. 17 illustrates an example ring pattern MRP disposed along an edge EG of a cathode hole (e.g., one cathode hole CH among the plurality of the cathode holes CH discussed above) and including four metal rings in the optical area OA of the display panel 110 according to aspects of the present disclosure.

Referring to FIG. 17, a plurality of metal rings MR may include a first metal ring MR1, a second metal ring MR2, a third metal ring MR3, and a fourth metal ring MR4.

The first metal ring MR1 may include a plurality of first protrusions PP1 protruding toward the inside of the cathode hole CH.

The second metal ring MR2 may include a plurality of second protrusions PP2 protruding toward the inside of the cathode hole CH.

The third metal ring MR3 may include a plurality of third protrusions PP3 protruding toward the inside of the cathode hole CH.

The fourth metal ring MR4 may include a plurality of fourth protrusions PP4 protruding toward the inside of the cathode hole CH.

The plurality of first protrusions PP1, the plurality of second protrusions PP2, the plurality of third protrusions PP3, and the plurality of fourth protrusions PP4 may be alternately arranged in the sequence of the first, second, third, and fourth protrusions PP1, PP2, PP3, and PP4.

The first metal ring MR1 may be located in a first metal layer MTL1.

The second metal ring MR2 may be located in a second metal layer MTL2.

The third metal ring MR3 may be located in a third metal layer MTL3.

The fourth metal ring MR4 may be located in a fourth metal layer MTL4.

All of the first to fourth metal layers MTL1 to MTL4 may be different metal layers. For example, the first to fourth metal layers MTL1 to MTL4 may be located as follows: the second metal layer MTL2 may be located on the first metal layer MTL1; the third metal layer MTL3 may be located on the second metal layer MTL2; and the fourth metal layer MTL4 may be located on the third metal layer MTL3.

Each of the plurality of first protrusions PP1 of the first metal ring MR1 may have a pointed end. Each of the plurality of second protrusions PP2 of the second metal ring MR2 may have a pointed end. Each of the plurality of third protrusions PP3 of the third metal ring MR3 may have a pointed end. Each of the plurality of fourth protrusions PP4 of the fourth metal ring MR4 may have a pointed end.

Figure 18:
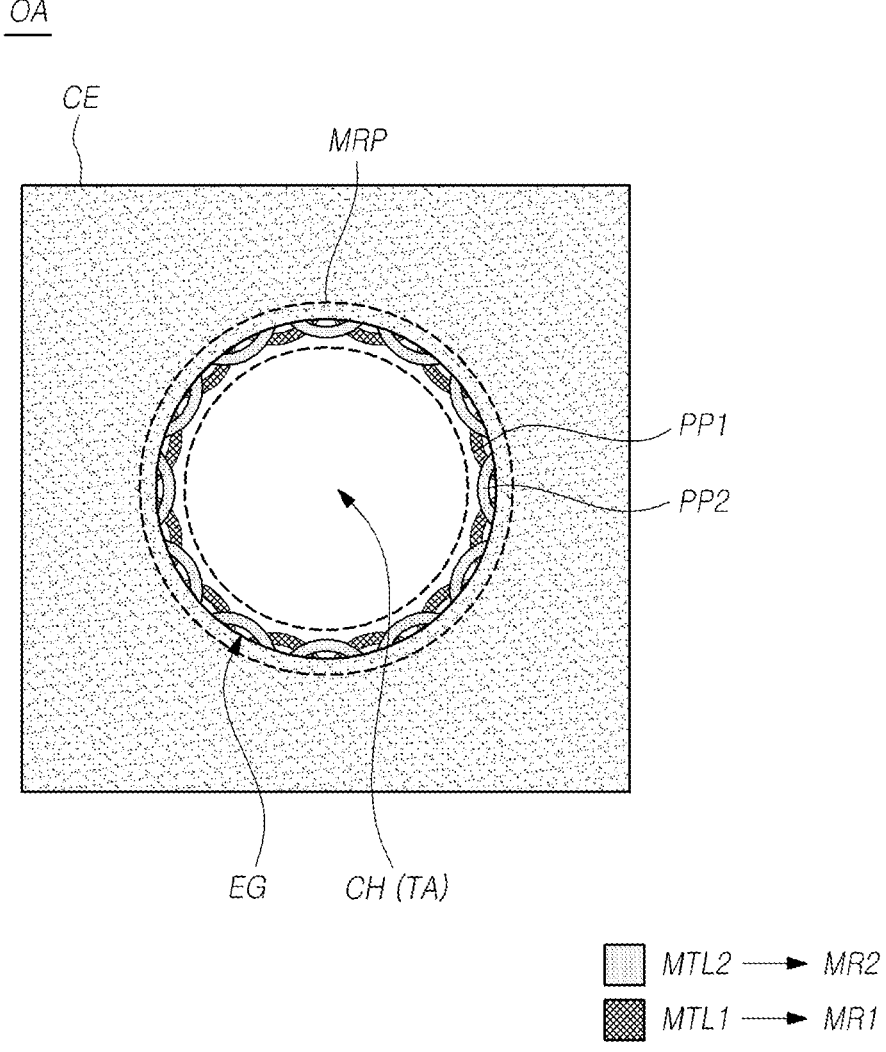
FIG. 18 illustrates an example ring pattern disposed along an edge of a cathode hole in the optical area of the display panel according to aspects of the present disclosure.

FIG. 18 illustrates an example ring pattern MRP disposed along an edge EG of a cathode hole (e.g., one cathode hole CH among the plurality of the cathode holes CH discussed above) in the optical area OA of the display panel 110 according to aspects of the present disclosure.

Referring to FIG. 18, a plurality of metal rings MR may include a first metal ring MR1, a second metal ring MR2, and the like.

The first metal ring MR1 may include a plurality of first protrusions PP1 protruding toward the inside of the cathode hole CH.

The second metal ring MR2 may include a plurality of second protrusions PP2 protruding toward the inside of the cathode hole CH.

Each of the plurality of first protrusions PP1 may be located between respective two adjacent second protrusions PP2 among the plurality of second protrusions PP2.

The first metal ring MR1 may be located in a first metal layer MTL1.

The second metal ring MR2 may be located in a second metal layer MTL2 being placed in a higher location than the first metal layer MTL1 from the substrate SUB.

Each of the plurality of first protrusions PP1 of the first metal ring MR1 may have a smooth (or rounded) end, not a pointed end. Each of the plurality of second protrusions PP2 of the second metal ring MR2 may have a smooth (or rounded) end, not a pointed end.

Figure 19:
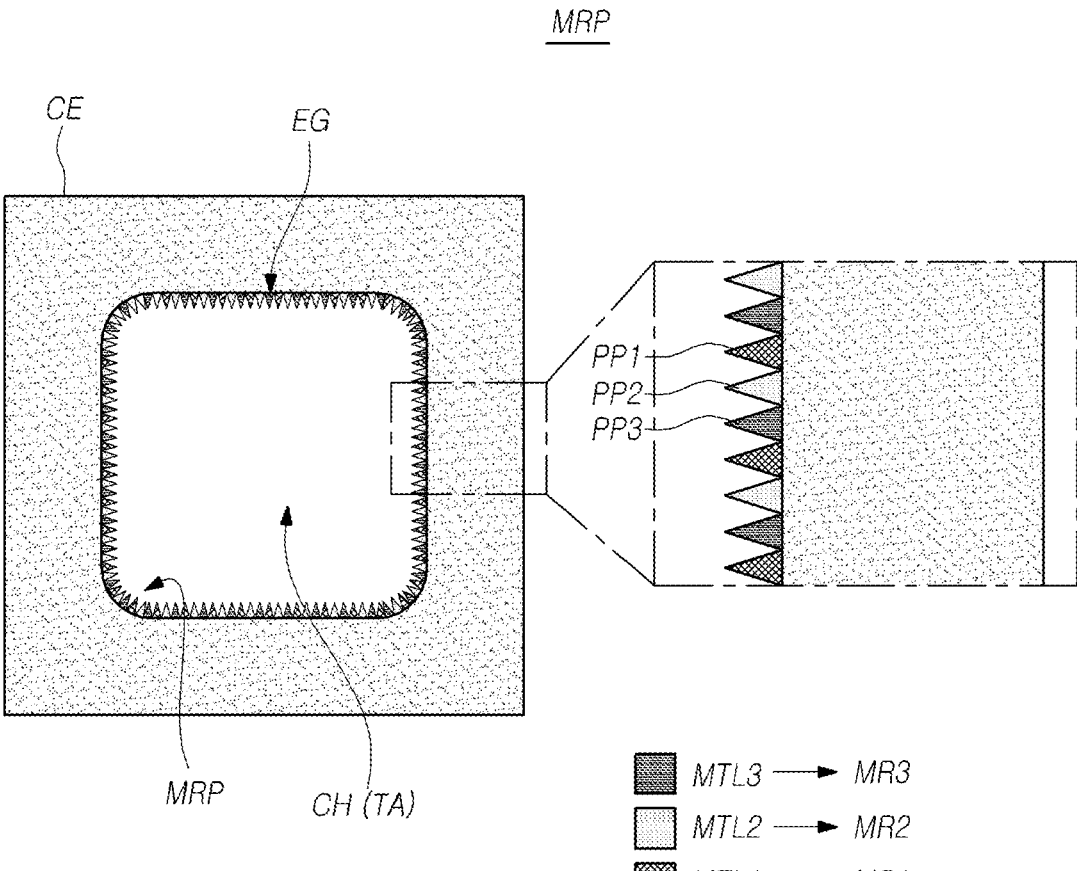
FIG. 19 illustrates an example ring pattern disposed along an edge of a cathode hole in an example where the cathode hole has a rectangular shape in the optical area of the display panel according to aspects of the present disclosure.

FIG. 19 illustrates an example ring pattern MRP disposed along an edge EG of a cathode hole (e.g., one cathode hole CH among the plurality of the cathode holes CH discussed above) in an example where the cathode hole CH has a rectangular shape in the optical area OA of the display panel 110 according to aspects of the present disclosure.

Referring to FIG. 19, the cathode hole CH of the cathode electrode CE may have a rectangular shape with rounded corners. Respective protrusions PP of two or more metal rings MR may be arranged along the edge EG of the cathode hole CH.

For example, the two or more metal rings MR disposed along the edge EG of the cathode hole CH may include a first metal ring MR1, a second metal ring MR2, and a third metal ring MR3.

The first metal ring MR1 may include a plurality of first protrusions PP1 protruding toward the inside of the cathode hole CH. The plurality of first protrusions PP1 of the first metal ring MR1 may be arranged along a rectangular edge EG of the cathode hole CH.

The second metal ring MR2 may include a plurality of second protrusions PP2 protruding toward the inside of the cathode hole CH. The plurality of second protrusions PP2 of the second metal ring MR2 may be arranged along the rectangular edge EG of the cathode hole CH.

The third metal ring MR3 may include a plurality of third protrusions PP3 protruding toward the inside of the cathode hole CH. The plurality of third protrusions PP3 of the third metal ring MR3 may be arranged along the rectangular edge EG of the cathode hole CH.

For example, the plurality of first protrusions PP1, the plurality of second protrusions PP2, and the plurality of third protrusions PP3 may be arranged along the rectangular edge EG of the cathode hole CH such that the first protrusions PP, the second protrusions PP2, and the third protrusions PP3 are alternately arranged in the sequence of the first protrusion PP1, the second protrusion PP2, and the third protrusion PP3.

The first metal ring MR1 may be located in a first metal layer MTL1.

The second metal ring MR2 may be located in a second metal layer MTL2 being placed in a higher location than the first metal layer MTL1 from the substrate SUB.

Each of the plurality of first protrusions PP1 of the first metal ring MR1 may have a pointed end. Each of the plurality of second protrusions PP2 of the second metal ring MR2 may have a pointed end.

The display panel 110 according to aspects of the present disclosure may include a plurality of transmission areas TA included in the display area DA in which one or more images can be displayed and allowing light to be transmitted, a cathode electrode (e.g., the cathode electrode CE discussed above) including a plurality of cathode holes CH respectively corresponding to the plurality of transmission areas TA, and a respective ring pattern MRP corresponding to each of the plurality of cathode holes CH. The respective ring pattern MRP may include a plurality of protrusions PP protruding toward the respective inside of each of the plurality of cathode holes CH.

The respective ring pattern MRP may be disposed to overlap a respective edge EG of each of the plurality of cathode holes CH.

The ring pattern MRP may include a plurality of protrusions PP protruding toward the inside of any one of the plurality of cathode holes CH.

The plurality of protrusions PP may include a plurality of first protrusions PP1, a plurality of second protrusions PP2, and a plurality of third protrusions PP3.

All or a portion of each of the plurality of protrusions PP in the ring pattern MRP may not overlap the cathode electrode CE.

The ring pattern MRP may include a plurality of metal rings MR located in different metal layers.

The plurality of metal layers may represent metal layers included in a pixel circuit for image display.

A vertical structure (e.g., stackup configuration) of the optical area OA to which a diffraction reduction structure (e.g., one of the diffraction reduction structure discussed above) according to one or more embodiments of the present disclosure is applied will be discussed with reference to FIG. 20.

Figure 20:
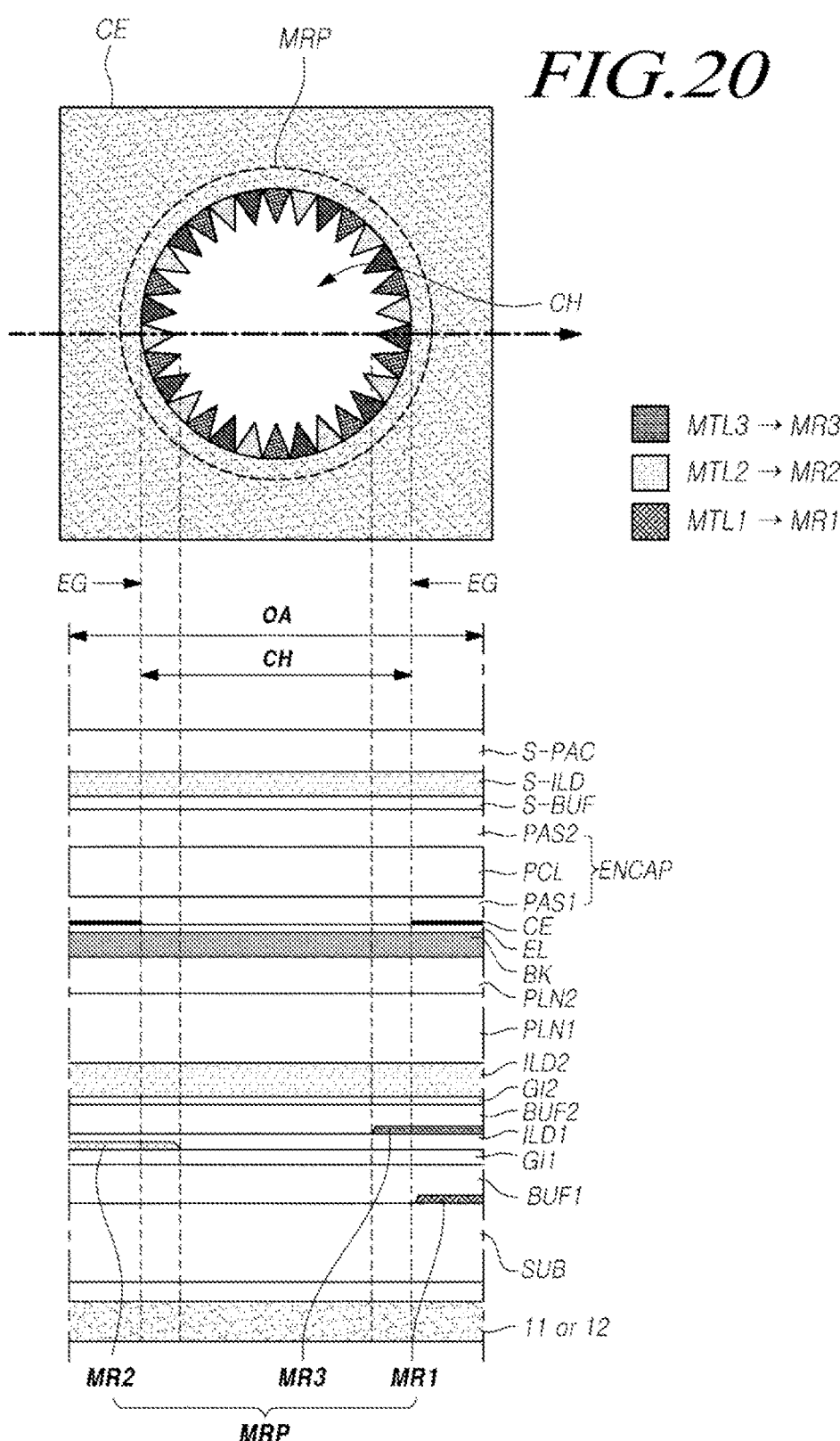
FIG. 20 is an example cross-sectional view of an area in which a cathode hole is formed in the optical area in the display panel according to aspects of the present disclosure.

FIG. 20 is an example cross-sectional view of an area in which a cathode hole CH (e.g., one cathode hole CH among the plurality of the cathode holes CH discussed above) is formed in the optical area OA in the display panel 110 according to aspects of the present disclosure.

It should be noted that insulating layers of FIG. 20 are the same as the insulating layers of FIGS. 8, 9, and 12. Considering such a similarity, discussions on the related layer stack will be briefly provided.

A first buffer layer BUF1 may be disposed on a substrate SUB. A first gate insulating layer GI1 may be disposed on the first buffer layer BUF1. A first interlayer insulating layer ILD1 may be disposed on the first gate insulating layer GI1.

A second buffer layer BUF2 may be disposed on the first interlayer insulating layer ILD1. A second gate insulating layer GI2 may be disposed on the second buffer layer BUF2. A second interlayer insulating layer ILD2 may be disposed on the second gate insulating layer GI2. First and second planarization layers PLN1 and PLN2 may be disposed on the second interlayer insulating layer ILD2.

A light emitting element ED may be formed on the first and second planarization layers PLN1 and PLN2.

Referring to FIG. 20, a lower shield metal layer may be located between the substrate SUB and the first buffer layer BUF1. The lower shield metal layer may be the first metal layer MTL1.

Referring to FIG. 20, in the first type or second type optical area OA, a first metal ring MR1 may be formed in the lower shield metal layer, which is the first metal layer MTL1.

The lower shield metal layer may be a layer in which the lower shield metal BSM located under the first active layer ACT1 of the first driving transistor DT1 is disposed, in the optical bezel area OBA located outside of the first type optical area OA1 of FIGS. 8 and 9. That is, the lower shield metal BSM may be located in the first metal layer MTL1 where the first metal ring MR1 is formed.

The lower shield metal layer may be a layer in which the lower shield metal BSM located under the active layers ACT1*s* and ACT2*s* of the first scan transistor ST1 and the second scan transistor ST2 is disposed, in the non-transmission area NTA of the second type optical area OA of FIG. 12. That is, the lower shield metal BSM may be located in the first metal layer MTL1 where the first metal ring MR1 is formed.

Referring to FIG. 20, a first gate metal layer may be located between the first gate insulating layer GI1 and the first interlayer insulating layer ILD1. The first gate metal layer may be the second metal layer MTL2.

Referring to FIG. 20, in the first type or second type optical area OA, a second metal ring MR2 may be formed in the first gate metal layer, which is the second metal layer MTL2.

The first gate metal layer may be a layer in which the first gate electrode G1 of the first driving transistor DT1 is disposed, and the first capacitor electrode PLT1 of the storage capacitor Cst is disposed, in the optical bezel area OBA located outside of the first type optical area OA1 of FIGS. 8 and 9. That is, the first gate electrode G1 of the first driving transistor DT1 and the first capacitor electrode PLT1 of the storage capacitor Cst may be located in the second metal layer MTL2 where the second metal ring MR2 is formed.

The first gate metal layer may be a layer in which the gate electrode of the first scan transistor ST1 is disposed, and the first capacitor electrode PLT1 of the first storage capacitor Cst1 is disposed, in the non-transmission area NTA of the second type optical area OA of FIG. 12. That is, the gate electrode of the first scan transistor ST1 and the first capacitor electrode PLT1 of the first storage capacitor Cst1 may be located in the second metal layer MTL2 where the second metal ring MR2 is formed.

Referring to FIG. 20, a second gate metal layer may be located between the first interlayer insulating layer ILD1 and the second buffer layer BUF2. The second gate metal layer may be the third metal layer MTL3.

Referring to FIG. 20, in the first type or second type optical area OA, a third metal ring MR3 may be formed in the second gate metal layer, which is the third metal layer MTL3.

The second gate metal layer may be a layer in which the second capacitor electrode PLT2 of the storage capacitor Cst is disposed, and the lower metal BML located under the second active layer ACT2 of the second driving transistor DT2 is disposed, in the optical bezel area OBA located outside of the first type optical area OA of FIGS. 8 and 9. That is, the second capacitor electrode PLT2 of the storage capacitor Cst and the lower metal BML may be located in the third metal layer MTL3 in which the third metal ring MR3 is disposed.

The second gate metal layer may be a layer in which the second capacitor electrode PLT2 of the first storage capacitor Cst1 is disposed, and the lower metal BML located under the first active layer ACT1 of the first driving transistor DT1 is disposed, in the second type optical area OA of FIG. 12. That is, the second capacitor electrode PLT2 of the first storage capacitor Cst1 and the lower metal BML may be located in the third metal layer MTL3 in which the third metal ring MR3 is disposed.

The one or more embodiments described above will be briefly described as follows.

According to aspects of the present disclosure, a display device (e.g., the display device 100 discussed above) can be provided that includes an optical area included in a display area in which images can be displayed and allowing light to be transmitted, a normal area included in the display area and located outside of the optical area, a cathode electrode commonly disposed in the optical area and the normal area and including a plurality of cathode holes in the optical area, and a ring pattern corresponding to any one of the plurality of cathode holes and disposed to overlap an edge of any one of the plurality of cathode holes.

The ring pattern may include a plurality of protrusions protruding toward the inside of any one of the plurality of cathode holes.

All or a portion of each of the plurality of protrusions of the ring pattern may not overlap the cathode electrode.

The ring pattern may include a plurality of metal rings located in a plurality of different metal layers.

Each of the plurality of metal rings may include a plurality of protrusions protruding toward the inside of any one of the plurality of cathode holes.

The plurality of metal rings may include a first metal ring and a second metal ring different from the first metal ring.

The first metal ring and the second metal ring may include a plurality of first protrusions and a plurality of second protrusions protruding toward the inside of any one of the plurality of cathode holes, respectively.

The plurality of first protrusions and the plurality of second protrusions may be alternately arranged. Accordingly, each of the plurality of second protrusions may be located between respective two adjacent first protrusions among the plurality of first protrusions.

The plurality of metal rings may further include a third metal ring.

The third metal ring may include a plurality of third protrusions protruding toward the inside of any one of the plurality of cathode holes.

The plurality of first protrusions, the plurality of second protrusions, and the plurality of third protrusions may be alternately arranged.

Accordingly, each of the plurality of third protrusions may be located between respective two adjacent second protrusions among the plurality of second protrusions, and each of the plurality of third protrusions may be located between a respective first protrusion and a respective second protrusion, which are adjacent to each other.

The plurality of metal rings may include at least two of a first metal ring located in a first metal layer, a second metal ring located in a second metal layer being placed in a higher location than the first metal layer from a substrate, and a third metal ring located in a third metal layer being placed in a higher location than the second metal layer from the substrate.

The display device may further include at least one transistor disposed in the optical area or the normal area, a lower shield metal disposed under the at least one transistor, and a storage capacitor disposed in the optical area or the normal area and including a first capacitor electrode and a second capacitor electrode.

The lower shield metal can be located in the first metal layer. The first capacitor electrode and the second capacitor electrode may be located in the second metal layer and the third metal layer, respectively.

The display device may include a bank disposed on an anode electrode and including a bank hole exposing a portion of the anode electrode, and an emission layer disposed on the bank and contacting the portion of the anode electrode exposed through the bank hole.

The cathode electrode may be disposed on the emission layer. An upper surface of the bank located under the plurality of cathode holes may be flat without being depressed or etched.

The display device may further include an encapsulation layer on the cathode electrode and touch sensor metals on the encapsulation layer. At least one of the touch sensor metals may be disposed in the normal area. In an embodiment, the touch sensor metals may not be disposed in the optical area. In another embodiment, the touch sensor metals may be disposed in the optical area and the normal area such that the optical area has a lower touch sensor metal density than the normal area.

In an example where the optical area is configured with a first type, the display device may further include an optical bezel area between the optical area and the normal area.

When the optical area is configured with the first type, light emitting elements may be disposed in the optical area, and pixel circuits for driving the light emitting elements disposed in the optical area may be disposed in the optical bezel area.

The pixel circuit may include at least one transistor and at least one storage capacitor. The plurality of cathode holes may overlap an area of the optical area where the light emitting elements are not disposed.

In an example where the optical area is configured with a second type, the optical area may include a plurality of transmission areas and a non-transmission area, and a plurality of light emitting elements and a plurality of pixel circuits may be disposed in the non-transmission area.

Each of the plurality of pixel circuits may include at least one transistor and at least one storage capacitor. The plurality of cathode holes may overlap the plurality of transmission areas.

The display device may further include an optical electronic device that overlaps the optical area and performs a predefined operation using visible light or light of a wavelength different from visible light. For example, the optical electronic device may be a camera (or an image sensor) capable of acquiring an image through light passing through the optical area.

According to aspects of the present disclosure, a display panel can be provided that includes a plurality of transmission areas included in a display area in which images can be displayed and allowing light to be transmitted, a cathode electrode including a plurality of cathode holes respectively corresponding to the plurality of transmission areas, and a ring pattern corresponding to any one of the plurality of cathode holes and including a plurality of protrusions protruding toward the inside of any one of the plurality of cathode holes.

The ring pattern may be disposed along an edge of any one of the plurality of cathode holes.

The ring pattern may be disposed to overlap the edge of any one of the plurality of cathode holes.

The ring pattern may include a plurality of protrusions protruding toward the inside of any one of the plurality of cathode holes.

All or a portion of each of the plurality of protrusions of the ring pattern may not overlap the cathode electrode.

The ring pattern may include a plurality of metal rings located in a plurality of different metal layers.

The plurality of metal layers may be included in metal layers included in a pixel circuit for image display.

According to the one or more embodiments described herein, a display panel (e.g., the display panel 110 discussed above) and a display device (e.g., the display device 100 discussed above) can be provided that include a light transmission structure for enabling at least one optical electronic device to normally receive light (e.g., visible light, infrared light, ultraviolet light, or the like) while not being exposed in a front surface of the display device.

According to the one or more embodiments described herein, a display panel (e.g., the display panel 110 discussed above) and a display device (e.g., the display device 100 discussed above) can be provided that are capable of improving the performance of an optical electronic device by reducing the amount of diffraction of light that may occur while light is transmitted through the display panel due to a structure in which the optical electronic device is disposed under, or in a lower location of, a display area of the display panel.

According to the one or more embodiments described herein, a display panel (e.g., the display panel 110 discussed above) and a display device (e.g., the display device 100 discussed above) can be provided that are capable of enabling a camera, which is an optical electronic device under, or in a lower location of, a display area of the display panel, to acquire high quality images.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
an optical area included in a display area in which one or more images are capable of being displayed and allowing light to be transmitted;
a normal area included in the display area and located outside of the optical area;
a cathode electrode commonly disposed in the optical area and the normal area;
a plurality of cathode holes included in the cathode electrode, the plurality of cathode holes in the optical area; and
a plurality ring patterns, each ring pattern of the plurality ring patterns corresponding to one cathode hole of the plurality of cathode holes and disposed to overlap an edge of the one cathode hole.

2. The display device of claim 1, wherein each ring pattern of the plurality ring patterns comprises a plurality of protrusions protruding toward the inside of one of the plurality of cathode holes corresponding to the ring pattern.

3. The display device of claim 2, wherein all or a portion of each of the plurality of protrusions in each ring pattern of the plurality ring patterns does not overlap the cathode electrode.

4. The display device of claim 1, wherein each ring pattern of the plurality ring patterns comprises a plurality of metal rings respectively located in a plurality of different metal layers.

5. The display device of claim 4, wherein for each ring pattern of the plurality ring patterns, each of the plurality of metal rings comprises a plurality of protrusions protruding toward the inside of one of the plurality of cathode holes corresponding to the ring pattern.

6. The display device of claim 5, wherein for each ring pattern of the plurality ring patterns, the plurality of metal rings comprises a first metal ring and a second metal ring different from the first metal ring,
wherein the first metal ring comprises a plurality of first protrusions protruding toward the inside of one cathode hole of the plurality of cathode holes corresponding to the ring pattern, and the second metal ring comprises a plurality of second protrusions protruding toward the inside of the one cathode hole, and
wherein each of the plurality of second protrusions is located between respective two adjacent first protrusions among the plurality of first protrusions.

7. The display device of claim 6, wherein for each ring pattern of the plurality ring patterns, the plurality of metal rings further comprises a third metal ring different from the first and second metal rings, and the third metal ring comprises a plurality of third protrusions protruding toward the inside of one of the plurality of cathode hole corresponding to the ring pattern,
wherein each of the plurality of third protrusions is located between respective two adjacent second protrusions among the plurality of second protrusions, and
wherein each of the plurality of third protrusions is located between a respective first protrusion and a respective second protrusion, which are adjacent to each other.

8. The display device of claim 4, wherein the plurality of metal rings further comprises:
a first metal ring located in a first metal layer;

a second metal ring located in a second metal layer being placed in a higher location than the first metal layer from a substrate of the display device; and
a third metal ring located in a third metal layer being placed in a higher location than the second metal layer from the substrate.

9. The display device of claim 8, further comprising:
a transistor disposed in the optical area or the normal area;
a lower shield metal located under the transistor; and
a storage capacitor disposed in the optical area or the normal area and comprising a first capacitor electrode and a second capacitor electrode,
wherein: the lower shield metal is located in the first metal layer;
the first capacitor electrode is located in the second metal layer; and
the second capacitor electrode is located in the third metal layer.

10. The display device of claim 1, further comprising:
a bank disposed on an anode electrode;
a bank hole included in the bank, the bank hole exposing a portion of the anode electrode; and
an emission layer disposed on the bank and contacting the portion of the anode electrode exposed through the bank hole,
wherein the cathode electrode is disposed on the emission layer, and
wherein an upper surface of the bank located under the plurality of cathode holes is flat without being depressed or etched.

11. The display device of claim 1, further comprising:
an encapsulation layer on the cathode electrode; and
touch sensor metals on the encapsulation layer,
wherein at least some of the touch sensor metals are disposed in the normal area, and the touch sensor metals are not disposed in the optical area, or
wherein the touch sensor metals are disposed in the optical area and the normal area such that the optical area has a lower touch sensor metal density than the normal area.

12. The display device of claim 1, further comprising:
an optical bezel area between the optical area and the normal area;
a light emitting element disposed in the optical area; and
a pixel circuit configured to drive the light emitting element disposed in the optical area and disposed in the optical bezel area,
wherein the pixel circuit comprises a transistor and a storage capacitor, and
wherein the plurality of cathode holes overlap an area of the optical area in which the light emitting element is not disposed.

13. The display device of claim 1, wherein the optical area comprises a plurality of transmission areas and a non-transmission area,
wherein a plurality of light emitting elements and a plurality of pixel circuits are disposed in the non-transmission area,
wherein each of the plurality of pixel circuits comprises a transistor and a storage capacitor, and
wherein the plurality of cathode holes overlap the plurality of transmission areas.

14. The display device of claim 1, further comprising an optical electronic device that overlaps the optical area and is capable of acquiring an image through light passing through the optical area.

15. The display device of claim 1, further comprising an optical bezel area between the optical area and the normal area;

wherein a pixel circuit configured to drive a light emitting element disposed in the optical area is disposed in the optical bezel area.

16. The display device of claim 15, wherein two light emitting elements, which are adjacent to each other in a row direction or a column direction and emit light of a same color, disposed in the optical area are driven by a same pixel circuit.

17. A display panel comprising:

a plurality of transmission areas included in a display area in which one or more images are displayed and allowing light to be transmitted;

a cathode electrode including a plurality of cathode holes respectively corresponding to the plurality of transmission areas; and a plurality of ring patterns, each ring pattern of the plurality ring patterns disposed along an edge of one cathode hole of the plurality of cathode holes corresponding to the ring pattern, wherein the ring pattern comprises a plurality of protrusions protruding toward the inside of the one cathode hole.

18. The display panel of claim 17, wherein each ring pattern of the plurality ring patterns is disposed to overlap the edge of one of the plurality of cathode holes corresponding to the ring pattern.

19. The display panel of claim 17, wherein all or a portion of each of the plurality of protrusions in each ring pattern of the plurality ring patterns does not overlap the cathode electrode.

20. The display panel of claim 17, wherein each ring pattern of the plurality ring patterns comprises a plurality of metal rings respectively located in a plurality of different metal layers.

21. The display panel of claim 20, wherein the plurality of metal layers are located in metal layers included in a pixel circuit for image display.

\* \* \* \* \*